(12) United States Patent  (10) Patent No.: US 9,269,906 B2
Suzuki et al.  (45) Date of Patent: Feb. 23, 2016

(54) LIGHT-EMITTING ELEMENT, LIGHT-EMITTING DEVICE, AND ELECTRONIC DEVICE

(75) Inventors: Tsunenori Suzuki, Kanagawa (JP); Satoko Shitagaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 840 days.

(21) Appl. No.: 12/206,252

(22) Filed: Sep. 8, 2008

(65) Prior Publication Data
US 2009/0072725 A1  Mar. 19, 2009

(30) Foreign Application Priority Data

Sep. 13, 2007  (JP) ................................. 2007-237910

(51) Int. Cl.
*H01L 51/54* (2006.01)
*H01L 51/00* (2006.01)
*H01L 51/50* (2006.01)

(52) U.S. Cl.
CPC .......... *H01L 51/0059* (2013.01); *H01L 51/006* (2013.01); *H01L 51/0031* (2013.01); *H01L 51/0072* (2013.01); *H01L 51/001* (2013.01); *H01L 51/007* (2013.01); *H01L 51/0081* (2013.01); *H01L 51/5052* (2013.01); *H01L 2251/308* (2013.01)

(58) Field of Classification Search
None
See application file for complete search history.

(56) References Cited

U.S. PATENT DOCUMENTS

| | | | |
|---|---|---|---|
| 6,387,546 B1 | 5/2002 | Hamada et al. | |
| 6,528,940 B1* | 3/2003 | Okada et al. | 313/505 |
| 6,566,807 B1* | 5/2003 | Fujita et al. | 313/506 |
| 6,730,929 B2 | 5/2004 | Fukuyama et al. | |
| 7,022,421 B2 | 4/2006 | Thompson et al. | |
| 7,078,113 B2 | 7/2006 | Thompson et al. | |
| 7,261,954 B2 | 8/2007 | Thompson et al. | |
| 7,288,331 B2 | 10/2007 | Thompson et al. | |
| 7,615,925 B2 | 11/2009 | Suzuki et al. | |
| 7,732,811 B2 | 6/2010 | Shitagaki et al. | |
| 7,839,075 B2 | 11/2010 | Suzuri et al. | |
| 7,898,168 B2 | 3/2011 | Seo et al. | |
| 7,902,742 B2 | 3/2011 | Suzuki et al. | |
| 8,030,646 B2 | 10/2011 | Suzuki et al. | |
| 8,319,210 B2 | 11/2012 | Shitagaki et al. | |
| 2001/0051284 A1* | 12/2001 | Ueda et al. | 428/690 |
| 2001/0052751 A1* | 12/2001 | Wakimoto et al. | 313/504 |
| 2002/0038867 A1* | 4/2002 | Kobori et al. | 257/40 |
| 2002/0105005 A1* | 8/2002 | Seo et al. | 257/101 |
| 2002/0197511 A1* | 12/2002 | D'Andrade et al. | 428/690 |
| 2003/0137239 A1* | 7/2003 | Matsuura et al. | 313/503 |
| 2004/0001969 A1* | 1/2004 | Cosimbescu et al. | 428/690 |
| 2004/0058193 A1* | 3/2004 | Hatwar | 428/690 |
| 2004/0061108 A1 | 4/2004 | Fukuyama et al. | |
| 2004/0086743 A1* | 5/2004 | Brown et al. | 428/690 |
| 2004/0245542 A1 | 12/2004 | Kim | |
| 2004/0247937 A1* | 12/2004 | Chen et al. | 428/690 |
| 2005/0098207 A1* | 5/2005 | Matsumoto et al. | 136/263 |
| 2005/0100760 A1 | 5/2005 | Yokoyama | |
| 2006/0008740 A1* | 1/2006 | Kido et al. | 430/296 |
| 2006/0011908 A1* | 1/2006 | Ohsawa et al. | 257/40 |
| 2006/0029828 A1 | 2/2006 | Kanno et al. | |
| 2006/0043859 A1 | 3/2006 | Fukuoka et al. | |
| 2006/0051615 A1 | 3/2006 | Kanno et al. | |
| 2006/0134461 A1* | 6/2006 | Huo et al. | 428/690 |
| 2006/0152148 A1* | 7/2006 | Yamamoto et al. | 313/504 |
| 2006/0158102 A1 | 7/2006 | Kawamura et al. | |
| 2006/0199038 A1* | 9/2006 | Lee | 428/690 |
| 2006/0228577 A1* | 10/2006 | Nagara | 428/690 |
| 2006/0284189 A1* | 12/2006 | Sakata et al. | 257/79 |
| 2007/0087221 A1 | 4/2007 | Wu et al. | |
| 2007/0120136 A1* | 5/2007 | Noda et al. | 257/98 |
| 2007/0148493 A1* | 6/2007 | Yoneyama et al. | 428/690 |
| 2007/0172699 A1 | 7/2007 | Nakashima et al. | |
| 2007/0200489 A1* | 8/2007 | Poon et al. | 313/502 |
| 2008/0006821 A1 | 1/2008 | Suzuki et al. | |
| 2008/0007164 A1 | 1/2008 | Suzuki et al. | |
| 2008/0007165 A1 | 1/2008 | Suzuki et al. | |

(Continued)

FOREIGN PATENT DOCUMENTS

EP  1 111 695 A2  6/2001
EP  1 565 041 A1  8/2005

(Continued)

OTHER PUBLICATIONS

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

(Continued)

*Primary Examiner* — Andrew K Bohaty
(74) *Attorney, Agent, or Firm* — Husch Blackwell LLP

(57) ABSTRACT

It is an object to provide a light-emitting element having long lifetime. A light-emitting element is provided, in which a light-emitting layer, a first layer, and a second layer are provided between a first electrode and a second electrode; the first layer is provided between the light-emitting layer and the first electrode; the second layer is provided between the light-emitting layer and the second electrode; the first layer is a layer for controlling the hole transport; the second layer is a layer for controlling the electron transport; and light emission is obtained from the light-emitting layer by applying voltage to the first electrode and the second electrode such that the potential of the first electrode is higher than that of the second electrode.

44 Claims, 24 Drawing Sheets

(56) References Cited

U.S. PATENT DOCUMENTS

| | | |
|---|---|---|
| 2009/0039771 A1 | 2/2009 | Oshiyama et al. |
| 2009/0102361 A1 | 4/2009 | Miki et al. |
| 2013/0285025 A1 | 10/2013 | Miki et al. |
| 2013/0338362 A1 | 12/2013 | Oshiyama et al. |
| 2014/0048787 A1 | 2/2014 | Miki et al. |

FOREIGN PATENT DOCUMENTS

| | | |
|---|---|---|
| EP | 1 653 784 A1 | 5/2006 |
| EP | 1 942 107 A1 | 7/2008 |
| EP | 2 256 838 A1 | 12/2010 |
| EP | 2 259 360 A2 | 12/2010 |
| EP | 2 555 274 A1 | 2/2013 |
| JP | 9-298088 | 11/1997 |
| JP | 2000-68057 | 3/2000 |
| JP | 2001-267081 | 9/2001 |
| JP | 2003-272870 | 9/2003 |
| JP | 2004-79413 | 3/2004 |
| JP | 2004-221045 | 8/2004 |
| JP | 2004-273163 | 9/2004 |
| JP | 2005-502165 | 1/2005 |
| JP | 2005-510025 | 4/2005 |
| JP | 2006-66890 | 3/2006 |
| JP | 2006-73640 | 3/2006 |
| JP | 2006-086482 A | 3/2006 |
| JP | 2006-156888 | 6/2006 |
| JP | 2007-161886 A | 6/2007 |
| JP | 2008-166745 | 7/2008 |
| JP | 2012-109634 | 6/2012 |
| WO | WO 03/022007 A1 | 3/2003 |
| WO | WO 03/022008 A1 | 3/2003 |
| WO | WO 03/043383 A1 | 5/2003 |
| WO | WO 2004/047499 A1 | 6/2004 |
| WO | WO 2005/009088 A1 | 1/2005 |
| WO | WO 2006/059512 A1 | 6/2006 |
| WO | WO 2006/059736 A1 | 6/2006 |
| WO | WO 2006115301 A1 * | 11/2006 |
| WO | WO 2007/004380 A1 | 1/2007 |
| WO | WO 2007/026847 A1 | 3/2007 |
| WO | WO 2008/069153 A1 | 6/2008 |

OTHER PUBLICATIONS

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi.T et al, "A Method of Measuring an Energy Level," High Molecular EL Materials—Development of Light-Emitting High Molecular Compounds, KYORITSU SHUPPAN, Dec. 25, 2004, pp. 64-67 (with English translation, pp. 1-3).

Cina, S. et al, "P-135: Efficient Electron Injection from PEDOT-PSS into a Graded-n-Doped Electron Transporting Layer in an Inverted OLED Structure," SID 05 Digest: SID International Symposium Digest of Technical Papers, vol. 36, 2005, pp. 819-821.

Lee, M-T et al, "Improved Stability of Organic Electroluminescent Devices by Doping Styrylamines in Hole or Electron Transporting Layer," Applied Physics Letters, vol. 86, No. 10, 2005, pp. 103501-1-103501-3.

European Search Report re application No. EP 07012956.4, dated Oct. 5, 2007.

Okumoto, K. et al., "Green Fluorescent Organic Light-Emitting Device with External Quantum Efficiency of Nearly 10%," Applied Physics Letters, vol. 89, No. 6, Aug. 9, 2006, pp. 063504-1-063504-3.

\* cited by examiner

LIGHT-EMITTING ELEMENT, LIGHT-EMITTING DEVICE, AND ELECTRONIC DEVICE

BACKGROUND OF THE INVENTION

1. Field of the Invention

The present invention relates to current excitation type light-emitting elements. Further, the present invention relates to light-emitting devices and electronic devices including the light-emitting elements.

2. Description of the Related Art

In recent years, research and development have been actively conducted on light-emitting elements utilizing electroluminescence. As a basic structure of these light-emitting elements, a structure in which a light-emitting substance is interposed between a pair of electrodes is used. By applying voltage to these elements, light emission can be obtained from the light-emitting substance.

Compared to liquid crystal displays, such light-emitting elements are of self-light-emitting type and have advantages such as high visibility of pixels and no need of backlights. Thus, the light-emitting elements are suitable for flat panel display elements. In addition, such light-emitting elements can be manufactured to be thin and lightweight, which is also highly advantageous. Further, the light-emitting elements have very high response speed.

Since the light-emitting elements can be formed into a film shape, surface light emission can be easily obtained by forming large-area elements. This characteristic is not easily obtained in point light sources typified by incandescent lamps or LEDs, or line light sources typified by fluorescent lamps. Therefore, the above described light-emitting elements also have a high utility value as a surface light source which is applicable to lighting systems and the like.

Light-emitting elements utilizing electroluminescence are broadly classified into two types according to whether the light-emitting substance is an organic compound or an inorganic compound.

In the case where the organic compound is used as a light-emitting substance, by voltage application to a light-emitting element, electrons and holes are injected to a layer containing a light-emitting organic compound from a pair of electrodes, so that current flows through the light-emitting element. Then, recombination of these carriers (the electrons and holes) makes the light-emitting organic compound be in an excited state and emit light when the excited state returns to a ground state. Based on this mechanism, such a light-emitting element is referred to as a current excitation type light-emitting element.

Note that excited states of the organic compound include a singlet excited state and a triplet excited state. Light emission from the singlet excited state is referred to as fluorescence, and light emission from the triplet excited state is referred to as phosphorescence.

Such light-emitting elements have many problems on materials, in improving element characteristics. In order to overcome the problems, improvement in element structure, development of materials, and the like have been carried out.

For example, in Reference 1 (Tetsuo Tsutsui and eight others, Japanese Journal of Applied Physics, vol. 38, L1502-L1504, 1999), a hole-blocking layer is provided in a light-emitting element which uses a phosphorescent material, so that the light-emitting element emits light efficiently.

SUMMARY OF THE INVENTION

However, as disclosed in Reference 1, the hole-blocking layer has poor durability, and the light-emitting element has short lifetime. Thus, the light-emitting element is desired to have longer lifetime.

In view of the foregoing, it is an object of the present invention to provide a light-emitting element having long lifetime. In addition, it is another object to provide a light-emitting device and an electronic device having long lifetime.

As a result of diligent studies, the present inventors have found that a light-emitting element with high light emission efficiency and a light-emitting element having long lifetime can be obtained by providing a layer for controlling the carrier transport.

According to one aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound with a hole-transporting property and a second organic compound which degrades the hole-transporting property of the first organic compound and is dispersed in the first organic compound; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; the second organic compound is a substance to which a hole is not injected and which degrades the hole-transporting property of the first organic compound; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; the second organic compound is a hole-blocking material which has a dipole moment of greater than or equal to 2.0 debye; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; a difference between the ionization potential of the second organic compound and that of the first organic compound is greater than or equal to 0.5 eV, and the dipole moment of the second organic compound is greater than or equal to 2.0 debye; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; the ionization potential of the second organic compound is greater than or equal to 5.8 eV, and the dipole moment of the second organic compound is greater than or equal to 2.0 debye; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; a difference between the ionization potential of the second organic compound and that of the first organic compound is greater than or equal to 0.5 eV, and the second organic compound has a molecular structure having a heterocyclic; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; the ionization potential of the second organic compound is greater than or equal to 5.8 eV, and the second organic compound has a molecular structure having a heterocyclic; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

According to another aspect of the present invention, a light-emitting element includes a light-emitting layer, a first layer, and a second layer between a first electrode and a second electrode; the first layer is provided between the light-emitting layer and the first electrode; the second layer is provided between the light-emitting layer and the second electrode; the first layer contains a first organic compound and a second organic compound; the weight percent of the first organic compound is higher than that of the second organic compound and the first organic compound has a hole-transporting property; the second organic compound is any one of an oxadiazole derivative, a triazole derivative, and a phenanthroline derivative; the second layer contains a third organic compound with an electron-transporting property and a fourth organic compound which degrades the electron-transporting property of the third organic compound and is dispersed in the third organic compound; and light is emitted from the light-emitting layer by applying voltage to the first electrode and the second electrode such that the potential of the first electrode is higher than that of the second electrode.

In the above aspect, the second organic compound is preferably any one of 1,3-bis[5-(p-tert-butylphenyl)-1,3,4-oxadiazol-2-yl]benzene, 3-(4-biphenylyl)-4-phenyl-5-(4-tert-butylphenyl)-1,2,4-triazole, and bathocuproine.

In the above aspect, the concentration of the second organic compound in the first layer is preferably greater than or equal to 1 wt % and less than or equal to 20 wt %.

In the above aspect, preferably, a layer is provided between the first layer and the light-emitting layer, and a layer is provided also between the first layer and the first electrode.

In the above aspect, the thickness of the first layer is preferably greater than or equal to 1 nm and less than or equal to 20 nm.

In the above aspect, preferably, the third organic compound has an electron-transporting property and the fourth organic compound has a hole-transporting property.

In addition, a difference between the lowest unoccupied molecular orbital level of the third organic compound and that of the fourth organic compound is preferably less than 0.3 eV.

In addition, preferably, the third organic compound is a metal complex, and the fourth organic compound is an aromatic amine compound.

In addition, preferably, $P_1$ which is a dipole moment of the third organic compound and $P_2$ which is a dipole moment of the fourth organic compound satisfy a relation of $P_1/P_2 \geq 3$ or $P_1/P_2 \leq 0.33$.

In the above aspect, preferably, the third organic compound is an organic compound with an electron-transporting property, and the fourth organic compound is an organic compound with an electron-trapping property.

In addition, the lowest unoccupied molecular orbital level of the fourth organic compound is preferably lower than that of the third organic compound by 0.3 eV or more.

In addition, preferably, the third organic compound is a metal complex.

In addition, preferably, the fourth organic compound is a coumarin derivative or a quinacridone derivative.

In the above aspect, the thickness of the second layer is preferably greater than or equal to 5 nm and less than or equal to 20 nm.

In the above aspect, preferably, the second layer and the light-emitting layer are in contact with each other.

The present invention includes light-emitting devices having the above-described light-emitting element in its category. The light-emitting devices in this specification include an image display device, a light-emitting device, and a light source (also, a lighting system). Further, the light-emitting devices include all of the following modules: modules in which a connector such as an FPC (flexible printed circuit), TAB (tape automated bonding) tape, or a TCP (tape carrier package) is attached to a panel provided with a light-emitting element; modules having TAB tape or a TCP provided with a printed wiring board at the end thereof; and modules having an IC (integrated circuit) directly mounted on a panel provided with a light-emitting element by a COG (chip on glass) method.

Further, electronic devices using the light-emitting element of the present invention for display portions are also included in the category of the present invention. Therefore, an electronic device of the present invention has a display portion, and the display portion includes the aforementioned light-emitting element and a controlling unit for controlling light emission of the light-emitting element.

In a light-emitting element of the present invention, a layer for controlling the carrier transport is provided, and a change with time of carrier balance can be suppressed. Thus, a light-emitting element having long lifetime can be obtained.

Furthermore, by applying the light-emitting element of the present invention to a light-emitting device and an electronic device, a light-emitting device and an electronic device having long lifetime can be obtained.

DETAILED DESCRIPTION OF THE INVENTION

Figure 1A:
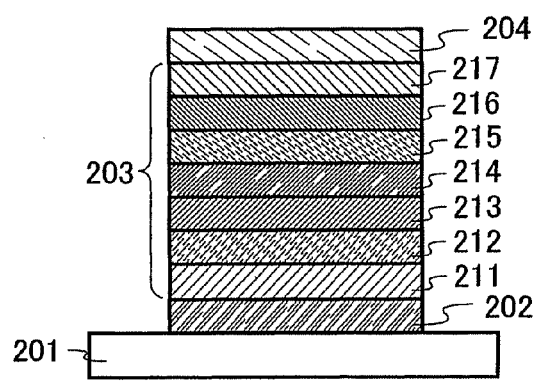
FIGS. 1A to 1D each illustrate a light-emitting element of the present invention.

Hereinafter, embodiment modes of the present invention will be described in detail with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be interpreted as being limited to the description of the embodiment modes to be given below.

(Embodiment Mode 1)

A light-emitting element of the present invention will be described below with reference to FIGS. 1A to 1D. A light-emitting element of the present invention includes a layer for controlling the hole transport and a layer for controlling the electron transport.

The light-emitting element of the present invention has a plurality of layers between a pair of electrodes. The plurality of layers are stacked by combining layers formed from a substance with a high carrier-injecting property or a substance with a high carrier-transporting property so that a light-emitting region is formed at a place apart from the electrodes, in other words, carriers are recombined at a portion apart from the electrodes.

In this embodiment mode, a light-emitting element includes a first electrode 202, a second electrode 204, and an EL layer 203 provided between the first electrode 202 and the second electrode 204. Note that in this embodiment mode, description is made on the assumption that the first electrode 202 functions as an anode and the second electrode 204 functions as a cathode. That is, description is made on the assumption that, when voltage is applied to the first electrode 202 and the second electrode 204 such that the potential of the first electrode 202 is higher than that of the second electrode 204, light emission can be obtained.

A substrate 201 is used as a support of the light-emitting element. As the substrate 201, glass, plastics, or the like can be used, for example. Note that other materials may also be used, as long as they can function as a support in a manufacturing process of the light-emitting element.

It is preferable that the first electrode 202 be formed using a metal, an alloy, or a conductive compound with a high work function (specifically, greater than or equal to 4.0 eV); a mixture thereof, or the like. For example, indium tin oxide (ITO), indium tin oxide containing silicon or silicon oxide, indium zinc oxide (IZO), indium oxide containing tungsten oxide and zinc oxide (IWZO), or the like can be used. Such conductive metal oxide films are generally formed by sputtering, but may also be formed by an ink-jet method, a spin coating method, or the like by application of a sol-gel method or the like. For example, a film of indium zinc oxide (IZO) can be formed by a sputtering method using a target in which zinc oxide of 1 wt % to 20 wt % is added to indium oxide. In addition, a film of indium oxide containing tungsten oxide and zinc oxide (IWZO) can be formed by a sputtering method using a target in which tungsten oxide of 0.5 wt % to 5 wt % and zinc oxide of 0.1 wt % to 1 wt % are included in indium oxide. Further, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of metal materials (e.g., titanium nitride), or the like can also be used.

In the case where a layer containing a composite material described later is used as a layer in contact with the first electrode, various metals, alloys, electrically conductive compounds, and mixture thereof can be used as the first electrode regardless of a level of a work function. For example, aluminum (Al), silver (Ag), an alloy containing aluminum (AlSi), or the like can be used. Further, an element belonging to Group 1 or Group 2 of the periodic table, which is a material with a low function, i.e., an alkali metal such as lithium (Li) or cesium (Cs), an alkaline earth metal such as magnesium (Mg), calcium (Ca), or strontium (Sr), an alloy containing these elements (e.g., MgAg or AlLi), a rare earth metal such as europium (Eu) or ytterbium (Yb), an alloy containing such rare earth metals, or the like can be used. A film of an alkali metal, an alkaline earth metal, or an alloy containing these metals can be formed by a vacuum evaporation method. In addition, a film of an alloy containing an alkali metal or an alkaline earth metal can be formed by a sputtering method. Furthermore, a film can be formed using a silver paste or the like by an ink-jet method or the like.

The EL layer 203 shown in this embodiment mode includes a hole-injecting layer 211, a layer 212 for controlling the hole transport, a hole-transporting layer 213, a light-emitting layer 214, a layer 215 for controlling the electron transport, an electron-transporting layer 216, and an electron-injecting layer 217. Note that it is acceptable as long as the EL layer 203 includes a light-emitting layer and a layer for controlling the carrier transport shown in this embodiment mode, and there is no particular limitation on the structure of the other stacked layers. In other words, there is no particular limitation on the stacked structure of the EL layer 203, and layers formed from a substance with a high electron-transporting property, a substance with a high hole-transporting property, a substance with a high electron-injecting property, a substance with a high hole-injecting property, a bipolar substance (a substance with a high electron-transporting property and a high hole-transporting property) and/or the like may be combined with a light-emitting layer and a layer for controlling the carrier transport shown in this embodiment mode as appropriate. For example, a hole-injecting layer, a hole-transporting layer, a light-emitting layer, an electron-transporting layer, an electron-injecting layer, and/or the like can be combined as appropriate. Materials for forming each layer will be specifically described below.

The hole-injecting layer 211 is a layer containing a substance with a high hole-injecting property. As the substance with a high hole-injecting property, the following can be used: molybdenum oxide, vanadium oxide, ruthenium oxide, tungsten oxide, manganese oxide, and the like. In addition, as a low-molecular organic compound, the following compounds are given: phthalocyanine-based compounds such as phthalocyanine (abbreviation: $H_2Pc$), copper(II) phthalocyanine (abbreviation: CuPc), and vanadyl phthalocyanine (abbreviation: VOPc); aromatic amine compounds such as 4,4′,4″-tris(N,N-diphenylamino)triphenylamine (abbreviation: TDATA), 4,4′,4″-tris[N-(3-methylphenyl)-N-phenylamino]triphenylamine (abbreviation: MTDATA), 4,4′-bis[N-(4-diphenylaminophenyl)-N-phenylamino]biphenyl (abbreviation: DPAB), 4,4′-bis(N-{4-[N′-(3-methylphenyl)-N′-phenylamino]phenyl}-N-phenylamino)biphenyl (abbreviation: DNTPD), 1,3,5-tris[N-(4-diphenylaminophenyl)-N-phenylamino]benzene (abbreviation: DPA3B); 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1); and the like.

Also, the hole-injecting layer 211 can be formed using a composite material in which a substance with an acceptor property is mixed into a substance with a high hole-transporting property. Note that, by using the composite material in which a substance with an acceptor property is mixed into a substance with a high hole-transporting property for the hole-injecting layer 211, a material used to form an electrode may be selected regardless of a level of its work function. In other words, besides a material with a high work function, a material with a low work function may also be used for the first electrode 202. Such a composite material can be formed by co-evaporating a substance with a high hole-transporting property and a substance with an acceptor property.

In this specification, "composition" refers to not only a state in which two types of materials are simply mixed, but also a state in which electric charges are given and received between materials by the mixture of a plurality of materials.

As an organic compound used for the composite material, various compounds such as an aromatic amine compound, a carbazole derivative, aromatic hydrocarbon, and a high-molecular compound (such as oligomer, dendrimer, or polymer) can be used. Note that, as the organic compound used for the composite material, it is preferable to use an organic compound with a high hole-transporting property. Specifically, a substance with a hole mobility of greater than or equal to $10^{-6}$ $cm^2/Vs$ is preferably used. However, other substances may also be used as long as hole-transporting properties thereof are higher than electron-transporting properties thereof. The organic compound which can be used for the composite material will be specifically described below.

As the organic compound that can be used for the composite material, the following can be used: aromatic amine compounds such as MTDATA, TDATA, DPAB, DNTPD, DPA3B, PCzPCA1, PCzPCA2, PCzPCN1, 4,4'-bis[N-(1-naphthyl)-N-phenylamino]biphenyl (abbreviation: NPB), and N,N'-bis(3-methylphenyl)-N,N'-diphenyl-[1,1'-biphenyl]-4,4'-diamine (abbreviation: TPD); carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), and 1,4-bis[4-(N-carbazolyl)phenyl]-2,3,5,6-tetraphenylbenzene; aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth); 2-tert-butylanthracene (abbreviation: t-BuAnth), 9,10-bis(4-methyl-1-naphthyl)anthracene (abbreviation: DMNA), 9-10-bis[2-(1-naphthyl)phenyl]2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene ((abbreviation: DPVPA); and the like.

As the substance with an acceptor property, organic compounds such as 7,7,8,8-tetracyano-2,3,5,6-tetrafluoroquinodimethane (abbreviation: F$_4$-TCNQ) and chloranil, and a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, or rhenium oxide is preferably used because of their high electron-accepting properties. Among these, molybdenum oxide is especially preferable since it is stable in the air, its hygroscopic property is low, and it can be easily treated.

In addition, for the hole-injecting layer 211, a high-molecular compound (such as oligomer, dendrimer, or polymer) can be used. For example, the following high-molecular compounds can be used: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine (abbreviation: Poly-TPD). Further, high-molecular compounds mixed with acid, such as poly(3,4-ethylenedioxythiophene)/poly(styrenesulfonate) (PEDOT/PSS) and polyaniline/poly(styrenesulfonate) (PAni/PSS) can also be used.

Further, a composite material formed by using the above high-molecular compound such as PVK, PVTPA, PTPDMA, or Poly-TPD and the above-mentioned substance with an acceptor property can also be used as the hole-injecting layer 211.

The layer 212 for controlling the hole transport contains a first organic compound and a second organic compound, and the weight percent of the first organic compound is higher than that of the second organic compound. In addition, the layer 212 for controlling the hole transport is preferably provided between the light-emitting layer 214 and the first electrode 202.

A hole-transporting property of the first organic compound is higher than an electron-transporting property thereof. That is, the first organic compound is a so-called hole-transporting organic compound. Specifically, aromatic amine compounds can be used for the first organic compound, such as MTDATA, TDATA, DPAB, DNTPD, DPA3B, PCzPCA1, PCzPCA2, PCzPCN1, 4,4'-bis[N-(1-naphthyl)-N-phenylamino]biphenyl (abbreviation: NPB), and N,N'-bis(3-methylphenyl)-N,N'-diphenyl-[1,1'-biphenyl]-4,4'-diamine (abbreviation: TPD). Further, high-molecular compounds such as PVK, PVTPA, PTPDMA, and Poly-TPD can also be used.

The second organic compound is an organic compound with a large dipole moment to which a hole is not injected. A hole-blocking material can be given as a material to which a hole is not injected. In general, the hole-blocking material is a material with a high ionization potential. In particular, a substance whose ionization potential is greater than or equal to 5.8 eV is preferable because a hole is not injected to such a substance. An ionization potential of greater than or equal to 6.0 eV is more preferable. Further, a substance with an ionization potential which is different from that of the first organic compound by 0.5 eV or more is also preferable for the second organic compound because a hole is not injected from the first organic compound to the second organic compound. Furthermore, the dipole moment of the second organic compound is preferably greater than or equal to 2.0 debye. In particular, the organic compound which has a dipole moment of much larger than 2.0 debye can be preferably used as the layer for controlling the hole transport.

For the second organic compound, specifically, the following materials can be used: oxadiazole derivatives such as 1,3-bis[5-(p-tert-butylphenyl)-1,3,4-oxadiazol-2-yl]benzene (abbreviation: OXD-7) and 2-(4-biphenylyl)-5-(4-tert-butylphenyl)-1,3,4-oxadiazole (abbreviation: PBD); triazole derivatives such as 3-(4-biphenylyl)-4-phenyl-5-(4-tert-butylphenyl)-1,2,4-triazole (abbreviation: TAZ01) and 3,5-bis(4-tert-butylphenyl)-4-phenyl-1,2,4-triazole (abbreviation: t-BuTAZ); phenanthroline derivatives such as bathophenanthroline (abbreviation: BPhen) and bathocuproine (abbreviation: BCP); and the like.

Figure 4:
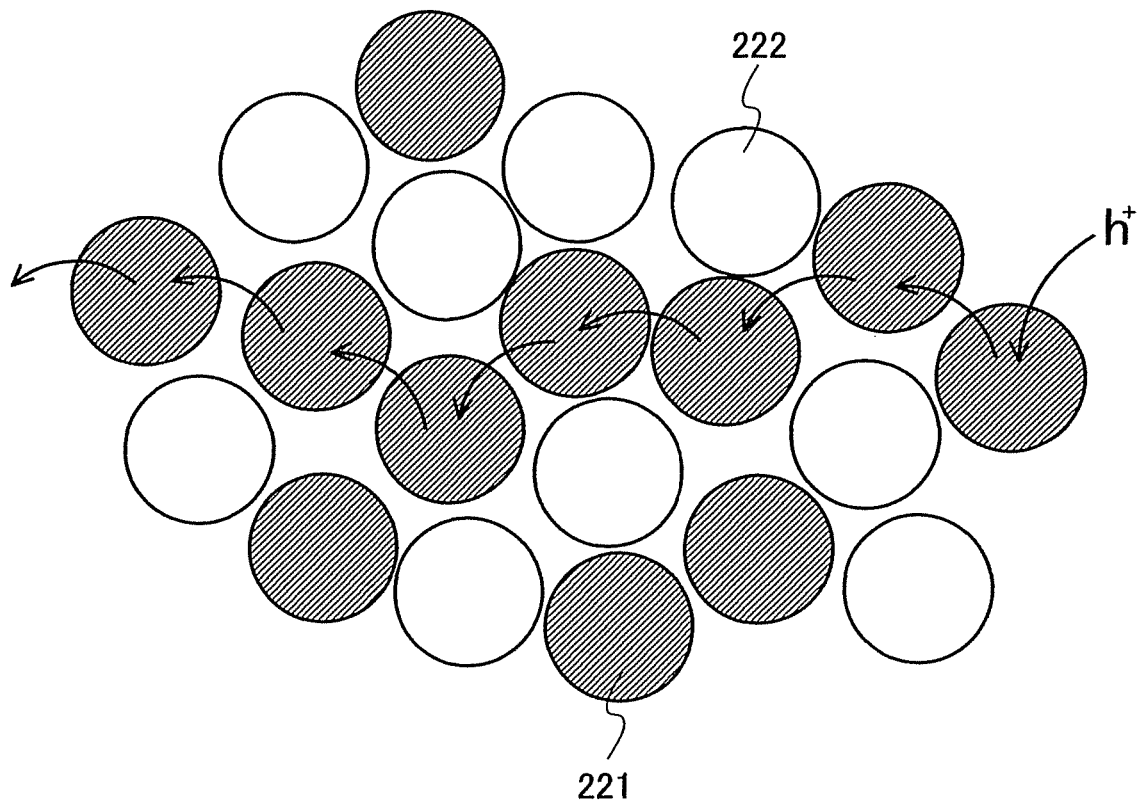
FIG. 4 illustrates a light-emitting element of the present invention.

FIG. 4 shows a conceptual view of the layer for controlling the hole transport in this embodiment mode. In FIG. 4, a first organic compound 221 has a hole-transporting property. Therefore, a hole is readily injected to the first organic compound 221, and the hole is readily transported to the vicinal first organic compound 221.

In contrast, a hole is not injected to a second organic compound 222 because a difference between the ionization potential of the second organic compound 222 and that of the first organic compound is 0.5 eV or more. Thus, a hole is not injected to the second organic compound, and the hole is transported by hopping only through the first organic compounds.

Further, the second organic compound 222 is a substance with a large dipole moment. Specifically, the dipole moment of the second organic compound is preferably greater than or equal to 2.0 debye. Inclusion of the second organic compound with a large dipole moment decreases the transporting rate of holes which are transported through the first organic compounds. That is, it is considered that the second organic compound with a large dipole moment which is located in the vicinity of the first organic compound has an effect to retard the transport of holes.

Therefore, by the inclusion of the second organic compound, the hole transporting rate of the entire layer becomes low compared to the case that the layer includes only the first organic compound 221. That is, by addition of the second organic compound, the carrier transport can be controlled. Further, by the control of the concentration of the second organic compound, the carrier transporting rate can be controlled.

In particular, as the dipole moment of the second organic compound is larger, the hole transporting rate becomes lower. Thus, in the case where a substance with a large dipole moment is used as the second organic compound, the above effect can be obtained even when the weight percent of the second organic compound contained in the layer for controlling the hole transport is low.

In a conventional element structure in which the layer for controlling the hole transport is not provided, holes injected from the first electrode pass through the hole-injecting layer and the hole-transporting layer, and are injected to the light-emitting layer. The holes injected to the light-emitting layer may reach the electron-transporting layer by passing through the light-emitting layer, in the case where the light-emitting layer has a hole-transporting property, that is, a material with the highest weight percent in the light-emitting layer has a hole-transporting property. When the holes reach the electron-transporting layer, the material contained in the electron-transporting layer may be deteriorated, leading to deterioration of the light-emitting element.

However, providing the layer for controlling the hole transport described in this embodiment mode can suppress the holes passing through the light-emitting layer and reaching the electron-transporting layer. Therefore, it is possible to suppress the holes reaching and deteriorating the electron-transporting layer. Accordingly, the light-emitting element can be prevented from deteriorating and can have longer lifetime.

In the case of a conventional element structure in which the layer for controlling the hole transport is not provided, a large part of holes injected from the first electrode are injected to the light-emitting layer without the transport being controlled. When the light-emitting layer has an electron-transporting property, that is, a material with the highest weight percent in the light-emitting layer has an electron-transporting property, a light-emitting region is formed around the interface between the light-emitting layer and the hole-transporting layer. However, around the interface between the light-emitting layer and the hole-transporting layer, there is a possibility that cations are generated due to excessive holes. Since the cations function as a quencher, light emission efficiency is lowered by the influence of the cations generated around the light-emitting region.

However, by providing the layer for controlling the hole transport described in this embodiment mode, generation of cations in or around the light-emitting layer by excessive holes can be suppressed, so that reduction in light emission efficiency can be suppressed. Therefore, a light-emitting element with high light emission efficiency can be obtained.

As described above, the control of the hole transport allows the improvement in carrier balance, which leads to improved recombination probability of holes and electrons; thus, high light emission efficiency can be obtained. As described in this embodiment mode, a structure in which the layer for controlling the hole transport is provided between the light-emitting layer and the first electrode functioning as an anode is particularly effective when the structure is applied to the light-emitting element having excessive holes. This is because, by providing the layer for controlling the hole transport in the light-emitting element having excessive holes, balance with electrons can be achieved and the transport of excessive holes can be suppressed.

As described in this embodiment mode, a structure in which the layer for controlling the hole transport is provided between the light-emitting layer and the first electrode functioning as an anode is particularly effective when the structure is applied to the light-emitting layer having excessive holes. Since a light-emitting element using an organic compound has excessive holes in many cases, the present invention can be preferably applied to a number of light-emitting elements using an organic compound.

Note that the concentration of the second organic compound in the layer for controlling the hole transport is preferably greater than or equal to 1 wt % and less than or equal to 20 wt %. With the concentration of greater than or equal to 1 wt % and less than or equal to 20 wt %, the lifetime of the light-emitting element can be kept long. In particular, it is more preferred that the concentration of the second organic compound be greater than or equal to 1 wt % and less than or equal to 10 wt %.

The thickness of the layer for controlling the hole transport is preferably greater than or equal to 1 nm and less than or equal to 20 nm. When the layer for controlling the hole transport is too thick, the hole transporting rate becomes too low, which could result in high driving voltage. When the layer for controlling the hole transport is too thin, on the other hand, it is impossible to achieve the function of controlling the hole transport. Therefore, the thickness of the layer for controlling the hole transport is preferably greater than or equal to 1 nm and less than or equal to 20 nm.

The hole-transporting layer 213 is a layer containing a substance with a high hole-transporting property. As the substance with a high hole-transporting property, low-molecular organic compounds such as aromatic amine compounds, e.g., NPB, TPD, 4,4'-bis[N-(9,9-dimethylfluoren-2-yl)-N-phenylamino]biphenyl (abbreviation: DFLDPBi) and 4,4'-bis[N-(spiro-9,9'-bifluoren-2-yl)-N-phenylamino]biphenyl (abbreviation: BSPB) can be used. The substances described here are mainly substances with a hole mobility of greater than or equal to $10^{-6}$ cm$^2$/Vs. However, other substances may also be used as long as the hole-transporting properties thereof are higher than the electron-transporting properties thereof. Note that the layer containing the substance with a high hole-transporting property is not limited to be a single layer but may be a stacked layer in which two or more layers formed of the above substances are stacked.

As the hole-transporting layer 213, a high-molecular compound such as PVK, PVTPA, PTPDMA, or Poly-TPD can also be used.

The light-emitting layer 214 is a layer containing a substance with a high light-emitting property, and various materials may be used for the light-emitting layer 214. As the substance with a high light-emitting property, for example, a fluorescent compound which emits fluorescence or a phosphorescent compound which emits phosphorescence can be used.

As a phosphorescent compound which can be used for the light-emitting layer, the following materials are given. For example, as a light-emitting material which exhibits bluish light emission, bis[2-(4',6'-difluorophenyl)pyridinato-N,C$^{2'}$]iridium(III)tetrakis(1-pyrazolyl)borate (abbreviation: FIr6); bis[2-(4',6'-difluorophenyl)pyridinato-N,C$^{2'}$]iridium(III)picolinate (abbreviation: FIrpic); bis[2-(3',5'bistrifluoromethylphenyl)pyridinato-N,C$^{2'}$]iridium(III)picolinate (abbreviation: Ir(CF$_3$ppy)$_2$(pic)); bis[2-(4',6'-difluorophenyl)pyridinato-N,C$^{2'}$]iridium(III)acetylacetonate (abbreviation: FIr(acac)); and the like are given. As a light-emitting material which exhibits greenish light emission, tris(2-phenylpyridinato-N,C$^{2'}$)iridium(III) (abbreviation: Ir(ppy)$_3$); bis(2-phenylpyridinato-N,C$^{2'}$)iridium(III)acetylacetonate (abbreviation: Ir(ppy)$_2$(acac)); bis(1,2-diphenyl-1H-benzimidazolato)iridium(III)acetylacetonate (abbreviation: Ir(pbi)$_2$(acac)); bis(benzo[h]quinolinato)iridium(III)acetylacetonate (abbreviation: Ir(bzq)$_2$(acac)); and the like are given. As a light-emitting material which exhibits yellowish light emission, bis(2,4-diphenyl-1,3-oxazolato-N,C$^{2'}$)iridium(III)acetylacetonate (abbreviation: Ir(dpo)$_2$(acac)); bis[2-(4'-perfluorophenylphenyl)pyridinato]iridium(III)acetylacetonate (abbreviation: Ir(p-PF-ph)$_2$(acac)); bis(2-phenylbenzothiazolato-N,C$^{2'}$)iridium(III)acetylacetonate (abbreviation: Ir(bt)$_2$(acac)); and the like are given. As a light-emitting material which exhibits orangish light emission, tris(2-phenylquinolinato-N,C$^{2'}$)iridium(III) (abbreviation: Ir(pq)$_3$); bis(2-phenylquinolinato-N,C$^{2'}$)iridium(III)acetylacetonate (abbreviation: Ir(pq)$_2$(acac)); and the like are given. As a light-emitting material which emits reddish light emission, the following organometallic complexes are given: bis[2-(2'-benzo[4,5-α]thienyl)pyridinato-N,C$^{3'}$]iridium(III)acetylacetonate (abbreviation: Ir(btp)$_2$(acac)); bis(1-phenylisoquinolinato-N,C$^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); 2,3,7,8,12,13,17,18-octaethyl-21H,23H-porphyrinplatinum(II) (abbreviation: PtOEP); and the like. In addition, a rare-earth metal complex such as tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); or tris[1-(2-thenoyl)-3,3,3-trifluoroacetonato](monophenanthroline)europium(III) (abbreviation: Eu(TTA)$_3$(Phen)) exhibits light emission from a rare-earth metal ion (electron transition between different multiplicities); therefore, such a rare-earth metal complex can be used as the phosphorescent compound.

As the fluorescent compound which can be used for the light-emitting layer, the following materials are given. For example, as a light-emitting material which exhibits bluish light emission, N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); and the like are given. As a light-emitting material which exhibits greenish light emission, N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); and the like are given. As a light-emitting material which exhibits yellowish light emission, rubrene; 5,12-bis(1,1'-biphenyl-4-yl)-6,11-diphenyltetracene (abbreviation: BPT); and the like are given. As a light-emitting material which exhibits reddish light emission, N,N,N',N'-tetrakis(4-methylphenyl)tetracene-5,11-diamine (abbreviation: p-mPhTD); 7,13-diphenyl-N,N,N',N'-tetrakis(4-methylphenyl)acenaphtho[1,2-α]fluoranthene-3,10-diamine (abbreviation: p-mPhAFD); and the like are given.

Note that the light-emitting layer may also have a structure in which the above-described substance with a high light-emitting property (sixth organic compound) is dispersed in another substance (fifth organic compound). As a substance in which the substance with a light-emitting property is dispersed, various kinds of substances can be used, and it is preferable to use a substance whose lowest unoccupied molecular orbital (LUMO) level is higher than that of the substance with a light-emitting property and whose highest occupied molecular orbital (HOMO) level is lower than that of the substance with a light-emitting property.

Specifically, as a substance in which the substance with a light-emitting property is dispersed, the following materials can be used: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDBA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, and BSPB; and the like.

As a substance in which the substance with a light-emitting property is dispersed, a plurality of kinds of substances can be used. For example, in order to suppress crystallization, a substance for suppressing crystallization such as rubrene may be further added. In addition, NPB, Alq, or the like can be further added thereto in order to efficiently transfer energy to the substance with a light-emitting property.

With a structure in which a substance with a high light-emitting property is dispersed in another substance, crystallization of the light-emitting layer 214 can be suppressed. Further, concentration quenching due to a high concentration of the substance with a high light-emitting property can be suppressed.

In addition, high-molecular compounds can be used for the light-emitting layer 214. Specifically, as a light-emitting material which exhibits bluish light emission, the following can be used: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. As a light-emitting material which exhibits greenish light emission, the following can be used: poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. As a light-emitting material which exhibits orangish to reddish light emission, the following can be used: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

The layer 215 for controlling the electron transport contains a third organic compound and a fourth organic compound, and the weight percent of the third organic compound is higher than that of the fourth organic compound. That is, the fourth organic compound is dispersed in the third organic compound. In addition, the layer 215 for controlling the electron transport is preferably provided between the light-emitting layer 214 and the second electrode 204.

The layer 215 for controlling the electron transport described in this embodiment mode contains a third organic compound and a fourth organic compound, and the third organic compound and the fourth organic compound transport different carriers.

In the case where the layer for controlling the electron transport is provided between the light-emitting layer and the second electrode functioning as a cathode, the third organic compound is preferably an organic compound with an electron-transporting property, and the fourth organic compound is preferably an organic compound with a hole-transporting property. That is, the third organic compound is preferably a substance with a higher electron-transporting property than a hole-transporting property, while the fourth organic compound is preferably a substance with a higher hole-transporting property than an electron-transporting property. In addition, a difference between the lowest unoccupied molecular orbital (LUMO) levels of the third organic compound and the fourth organic compound is preferably less than 0.3 eV, more preferably less than or equal to 0.2 eV. That is, it is preferable that, in thermodynamic terms, electrons which are carriers can be easily transported between the third organic compound and the fourth organic compound.

Figure 5:
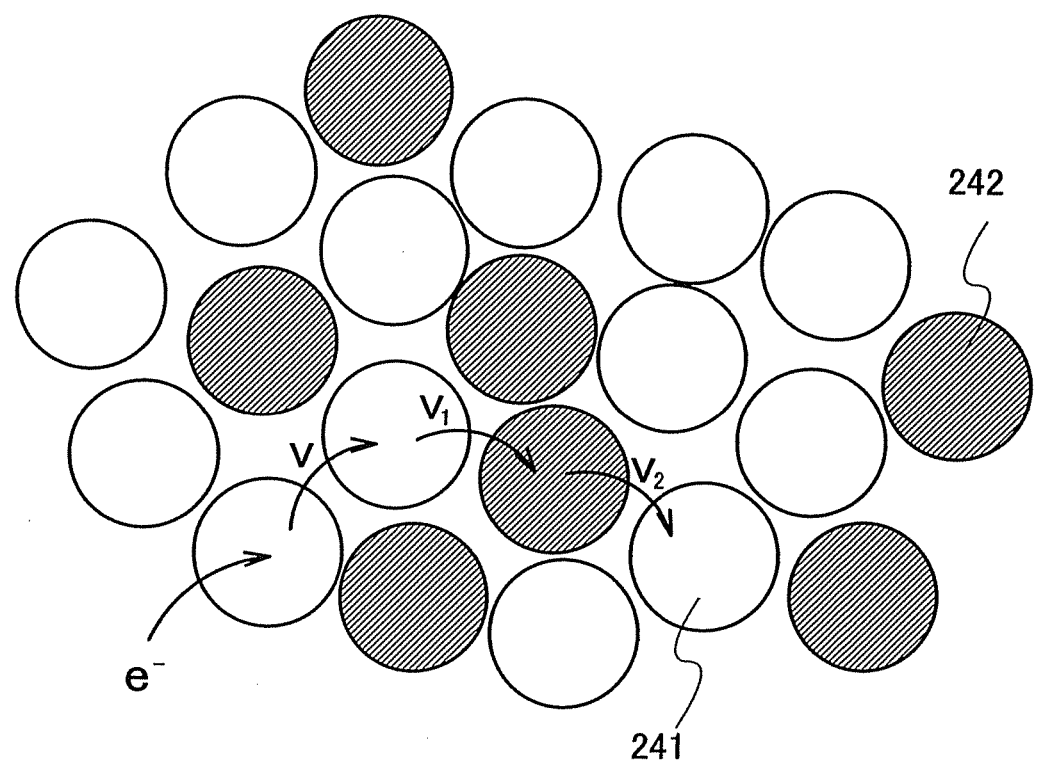
FIG. 5 illustrates a light-emitting element of the present invention.

FIG. 5 shows a conceptual view of the layer for controlling the electron transport described this embodiment mode. In FIG. 5, since a third organic compound 241 has an electron-transporting property, an electron is readily injected to the third organic compound 241, and the electron is readily transported to the vicinal third organic compound 241. That is, the rate at which electrons are injected to the third organic compound and the rate (V) at which the electrons are discharged from the third organic compound are high.

Meanwhile, in thermodynamic terms, there is a possibility that an electron is injected to a fourth organic compound 242 which is the organic compound with a hole-transporting property because the fourth organic compound has an LUMO level close to that of the third organic compound. However, the rate ($V_1$) at which electrons are injected from the third organic compound 241 which is the organic compound with an electron-transporting property to the fourth organic compound 242 which is the organic compound with a hole-transporting property, or the rate ($V_2$) at which electrons are injected from the fourth organic compound 242 to the third organic compound 241 is lower than the rate (V) at which electrons are injected from the third organic compound 241 to the third organic compound 241.

Therefore, when the layer contains the fourth organic compound, the electron transporting rate of this layer is low compared to the case that the layer is made of only the third organic compound 241. In other words, by addition of the fourth organic compound, the carrier transport can be controlled. Further, by controlling the concentration of the fourth organic compound, the carrier transporting rate can be controlled.

As described above, the third organic compound is preferably an organic compound with an electron-transporting property in this embodiment mode. Specifically, the following materials can be used: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3); high-molecular compounds such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy); and the like.

As the fourth organic compound, an organic compound with a hole-transporting property is preferable. Specifically, the following materials can be used: condensed aromatic hydrocarbons such as 9,10-diphenylanthracene (abbreviation: DPAnth) and 6,12-dimethoxy-5,11-diphenylchrysene; aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, and BSPB; and compounds having an amino group such as coumarin 7 and coumarin 30. Further, high-molecular compounds such as PVK, PVTPA, PTPDMA, and Poly-TPD can be used.

By the above combination, the electron transport from the third organic compound to the fourth organic compound or the electron transport from the fourth organic compound to the third organic compound can be suppressed, whereby the electron transporting rate in the layer for controlling the electron transport can be suppressed. The layer for controlling the electron transport is formed such that the fourth organic compound is dispersed in the third organic compound; therefore, crystallization or aggregation is hardly caused with time. Accordingly, the above-mentioned effect of suppressing the electron transport does not easily change with time, and carrier balance does not change with time, either. This leads to improvement in lifetime of the light-emitting element, in other words, improvement in reliability.

Note that among the above-mentioned combinations, it is preferable to combine a metal complex as the third organic compound and an aromatic amine compound as the fourth organic compound. A metal complex has a high electron-transporting property and has a large dipole moment, whereas an aromatic amine compound has a high hole-transporting property and has a comparatively small dipole moment. Thus, by combination of substances whose dipole moments differ greatly from each other, the above-mentioned effect of suppressing the electron transport can be further increased. Specifically, such a combination is preferably used that $P_1$ which is a dipole moment of the third organic compound and $P_2$ which is a dipole moment of the fourth organic compound satisfy $P_1/P_2 \geq 3$ or $P_1/P_2 \leq 0.33$.

For example, the dipole moment of Alq that is a metal complex is 9.40 debye, and the dipole moment of 2PCAPA that is an aromatic amine compound is 1.15 debye. Accordingly, in the case where an organic compound with an electron-transporting property like a metal complex is used as the third organic compound and an organic compound with a hole-transporting property like an aromatic amine compound is used as the fourth organic compound as in this embodiment mode, $P_1/P_2 \geq 3$ is preferably satisfied.

In addition, it is preferable that the emission colors of the fourth organic compound contained in the layer 215 for controlling the electron transport and the substance with a high light-emitting property contained in the light-emitting layer 214 be similar colors. Specifically, a difference between the wavelength of the highest peak of the emission spectrum of the fourth organic compound and that of the substance with a high light-emitting property is preferably within 30 nm. With the difference within 30 nm, the emission color of the fourth organic compound and the emission color of the substance with a high light-emitting property can be similar colors. Accordingly, even in the case where the fourth organic compound emits light due to change in voltage or the like, change in emission color of the light-emitting element can be suppressed. However, the fourth organic compound does not always need to emit light.

The thickness of the layer 215 for controlling the electron transport is preferably greater than or equal to 5 nm and less than or equal to 20 nm. When the layer 215 for controlling the electron transport is too thick, the carrier transporting rate becomes too low, which could result in high driving voltage. Moreover, the emission intensity of the layer 215 for controlling the electron transport may be increased. When the layer 215 for controlling the electron transport is too thin, on the other hand, it is impossible to achieve the function of controlling the carrier transport. Therefore, the thickness of the layer 215 for controlling the electron transport is preferably greater than or equal to 5 nm and less than or equal to 20 nm.

In a conventional element structure in which the layer for controlling the electron transport is not provided, electrons injected from the second electrode pass through the electron-injecting layer and the electron-transporting layer, and are injected to the light-emitting layer. The electrons injected to the light-emitting layer may reach the hole-transporting layer by passing through the light-emitting layer, in the case where the light-emitting layer has an electron-transporting property, that is, a material with the highest weight percent in the light-emitting layer has an electron-transporting property. When the electrons reach the hole-transporting layer, the material contained in the hole-transporting layer may be deteriorated, leading to deterioration of the light-emitting element.

However, providing the layer for controlling the electron transport described in this embodiment mode can suppress the electrons passing through the light-emitting layer and reaching the hole-transporting layer. Therefore, it is possible to suppress the electrons reaching and deteriorating the hole-transporting layer. Accordingly, the light-emitting element can be prevented from deteriorating and can have longer lifetime.

The electron-transporting layer 216 is a layer containing a substance with a high electron-transporting property. For example, low-molecular organic compounds such as metal complexes, e.g., tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ), can be used. In addition, heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2"-(1,3,5-benzenetriyl)tris(1-phenyl-1-H-benzimidazole) (abbreviation: TPBI), bathophenanthroline (abbreviation: BPhen), and bathocuproine (abbreviation: BCP) can be used. The substances described here are mainly substances having an electron mobility of greater than or equal to $10^{-6}$ cm$^2$/Vs. Other substances may also be used for the electron-transporting layer as long as they have a higher electron-transporting property than a hole-transporting property. Further, the electron-transporting layer is not limited to be a single layer and may be a stacked layer of two or more layers formed from the above substances.

In addition, as the electron-transporting layer 216, high-molecular compounds such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can be used.

The electron-injecting layer 217 is a layer containing a substance with a high electron-injecting property. As a substance with a high electron-injecting property, an alkali metal, an alkaline earth metal, and a compound thereof, such as lithium fluoride (LiF), cesium fluoride (CsF), and calcium fluoride (CaF$_2$) can be used. For example, a layer of a substance with an electron-transporting property, which contains an alkali metal, an alkaline earth metal, or a compound thereof, such as Alq containing magnesium (Mg), may be used. By using the layer made of a substance with an electron-transporting property in which an alkali metal or an alkaline earth metal is mixed as the electron-injecting layer, electrons can be efficiently injected from the second electrode 204, which is preferable.

The second electrode 204 can be formed using a metal, an alloy, or an electrically conductive compound with a low work function (specifically, less than or equal to 3.8 eV); a mixture of them; or the like. Specific examples of such cathode materials include elements belonging to Group 1 or 2 of the periodic table, i.e., alkali metals such as lithium (Li) and cesium (Cs); alkaline earth metals such as magnesium (Mg), calcium (Ca), and strontium (Sr); alloys of them (e.g., MgAg and AlLi); rare earth metals such as europium (Eu) and ytterbium (Yb), and alloys of them. A film of an alkali metal, an alkaline earth metal, or an alloy containing these can be formed by a vacuum evaporation method. Further, a film made of an alloy containing an alkali metal or an alkaline earth metal can be formed by a sputtering method. Further alternatively, the second electrode 204 can be formed using a silver paste or the like by an ink-jet method or the like.

When the electron-injecting layer 217 which is a layer having a function of promoting electron injection is provided between the second electrode 204 and the electron-transporting layer 216, the second electrode 204 can be formed using any of various conductive materials such as Al, Ag, ITO, and ITO containing silicon or silicon oxide, regardless of levels of their work functions. A film of these conductive materials can be formed by a sputtering method, an ink-jet method, a spin coating method, or the like.

Various methods including a dry process and a wet process can be used for forming the EL layer. For example, a vacuum evaporation method, an ink-jet method, a spin coating method, or the like may be used. In addition, a different method may be used to form each electrode or each layer.

For example, among the above-described materials, a high-molecular compound may be used to form the EL layer by a wet process. Alternatively, a low-molecular organic compound may be used to form the EL layer by a wet process. Further, it is also possible to form the EL layer by using a low-molecular organic compound and using a dry process such as a vacuum evaporation method.

The electrodes may be formed by a wet process using a sol-gel method, or by a wet process using a paste of a metal material. Alternatively, the electrodes can be formed by a dry process such as a sputtering method or a vacuum evaporation method.

For example, in the case where the light-emitting element of the present invention is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even with the use of a large-area substrate.

In the light-emitting element of the present invention having the above structure, current flows due to a potential difference generated between the first electrode 202 and the second electrode 204, whereby holes and electrons are recombined in the EL layer 203 and light emission is obtained.

Figure 3A:
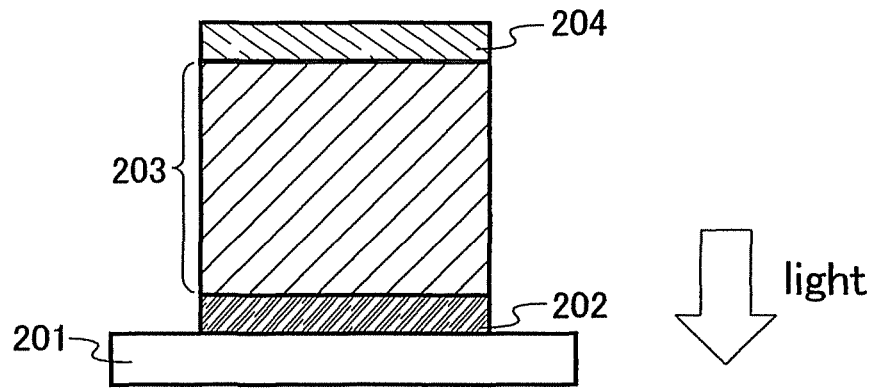
FIGS. 3A to 3C each illustrate a light-emitting element of the present invention.
Figure 3B:
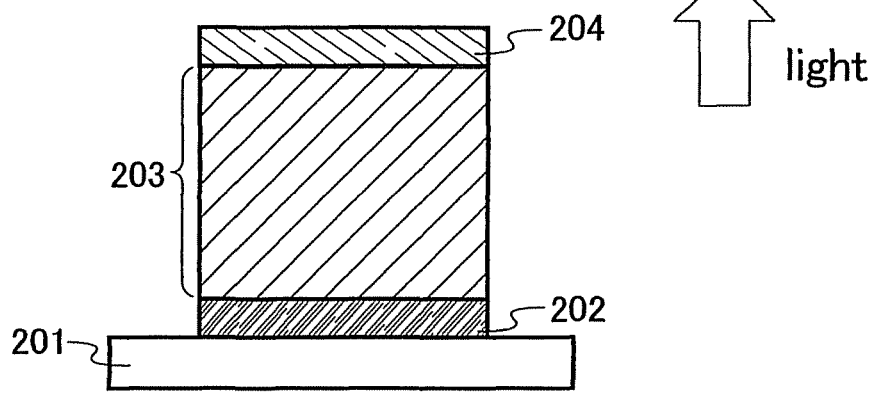
Figure 3C:
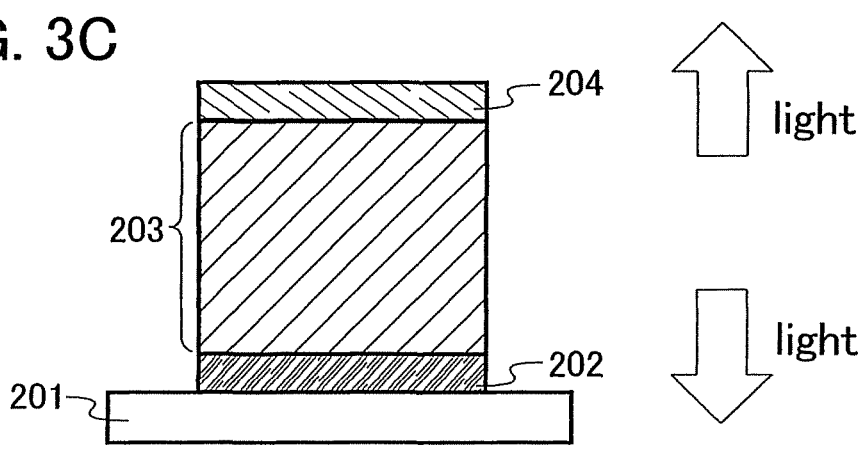

Light emission is extracted to the outside through one or both of the first electrode 202 and the second electrode 204. Therefore, one or both of the first electrode 202 and the second electrode 204 are a light-transmitting electrode. When only the first electrode 202 is a light-transmitting electrode, light emission is extracted from the substrate side through the first electrode 202 as illustrated in FIG. 3A. When only the second electrode 204 is a light-transmitting electrode, light emission is extracted from the side opposite to the substrate side through the second electrode 204 as illustrated in FIG. 3B. When both of the first electrode 202 and the second electrode 204 are light-transmitting electrodes, light emission is extracted from both the substrate side and the side opposite to the substrate side through the first electrode 202 and the second electrode 204 as illustrated in FIG. 3C.

A structure of layers provided between the first electrode 202 and the second electrode 204 is not limited to the above structure. Any structure besides the above can be employed as long as a light-emitting region for recombination of holes and electrons is positioned away from the first electrode 202 and the second electrode 204 so as to prevent quenching due to the proximity of the light-emitting region and a metal, and also a layer for controlling the carrier transport is provided.

That is, there is no particular limitation on the stacked structure of the layers, and layers made of a substance with a high electron-transporting property, a substance with a high hole-transporting property, a substance with a high electron-injecting property, a substance with a high hole-injecting property, a bipolar substance (a substance with a high electron-transporting property and a high hole-transporting property), and/or the like may be combined with the light-emitting layer and the layer for controlling the carrier transport described in this embodiment mode as appropriate.

Since the layer for controlling the hole transport controls the hole transport, it is preferably provided between the light-emitting layer and the electrode functioning as an anode.

Figure 1B:
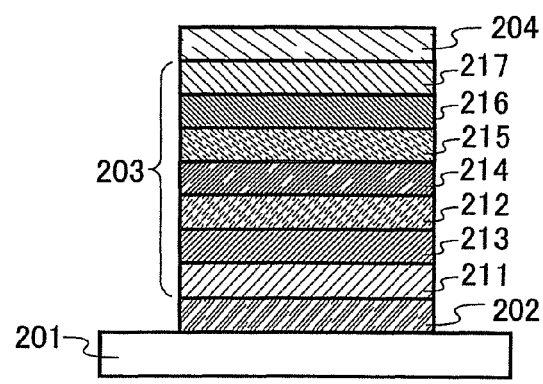
Figure 1C:
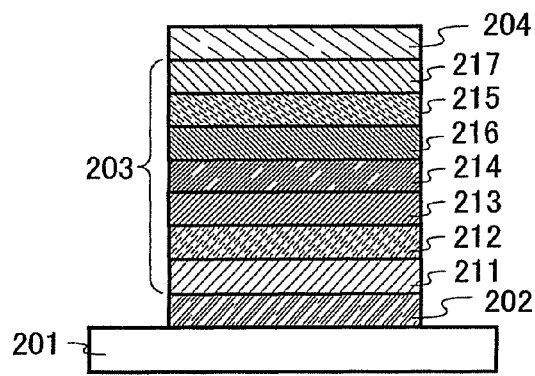

When a layer is formed between the light-emitting layer 214 and the layer 212 for controlling the hole transport as illustrated in FIGS. 1A and 1C, that is, when the light-emitting layer 214 and the layer 212 for controlling the hole transport are not in contact with each other, undesired interaction which occurs between the light-emitting layer 214 and the layer 212 for controlling the hole transport are not likely to be generated. Therefore, such a structure is preferable because deterioration of the light-emitting element can be suppressed.

Figure 1D:
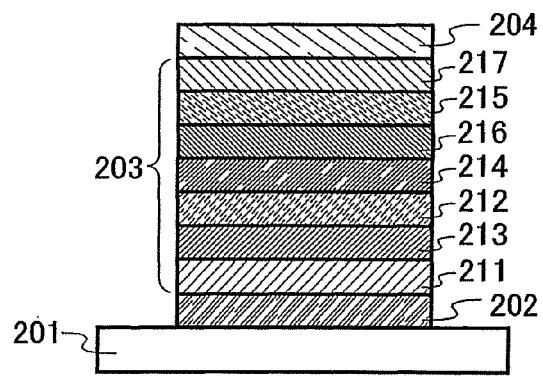
Figure 2A:
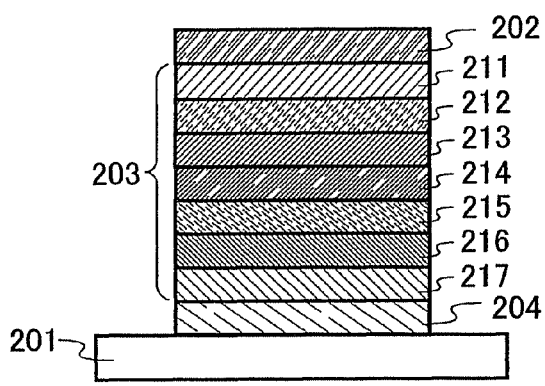
FIGS. 2A to 2D each illustrate a light-emitting element of the present invention.
Figure 2B:
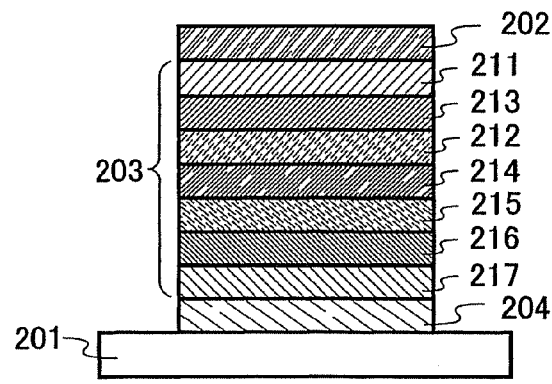
Figure 2C:
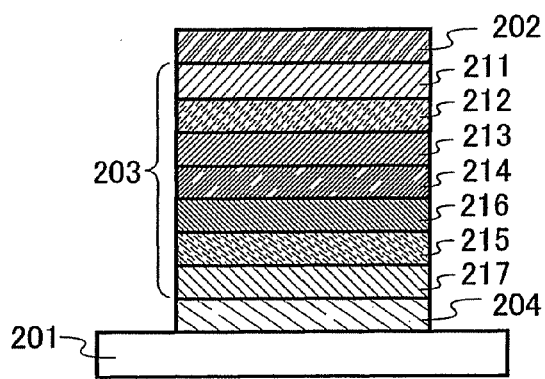
Figure 2D:
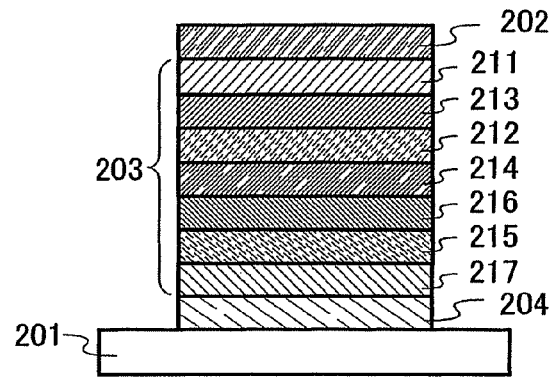

However, as illustrated in FIGS. 1B and 1D, a structure in which the light-emitting layer 214 and the layer 212 for controlling the hole transport are in contact with each other may also be employed.

Since a layer for controlling the electron transport controls the electron transport, it is preferably provided between the light-emitting layer and the electrode functioning as a cathode. The layer for controlling the electron transport is preferably provided to be in contact with the light-emitting layer as illustrated in FIGS. 1A and 1B. By providing the layer for controlling the electron transport to be in contact with the light-emitting layer, electron injection to the light-emitting layer can be directly controlled. Therefore, a change in carrier balance with time in the light-emitting layer can be more suppressed, whereby an effect of improving the lifetime of the light-emitting element can be obtained. Furthermore, the process can be simplified.

In addition, the layer for controlling the electron transport is preferably provided so as to be in contact with the light-emitting layer, and in such a case, the types of the third organic compound contained in the layer for controlling the electron transport and the organic compound with a high weight percent in the light-emitting layer are preferably different from each other. In particular, in the case where the light-emitting layer contains a substance (fifth organic compound) in which a substance with a high light-emitting property is dispersed and the substance with a high light-emitting property (sixth organic compound), the types of the fifth organic compound and the third organic compound are preferably different from each other. With such a structure, the electron transport from the layer for controlling the electron transport to the light-emitting layer can be suppressed between the third organic compound and the fifth organic compound. Thus, the effect obtained by providing the layer for controlling the electron transport can be further increased.

Not that a layer may be formed between the light-emitting layer 214 and the layer 215 for controlling the electron transport as illustrated in FIGS. 1C and 1D.

In addition, as illustrated in FIGS. 2A to 2D, over the substrate 201, the second electrode 204 functioning as a cathode, the EL layer 203, and the first electrode 202 functioning as an anode may be stacked in this order. The light-emitting element illustrated in FIG. 2A has a structure in which the layers of the EL layer illustrated in FIG. 1A are stacked in a reverse order, the light-emitting element illustrated in FIG. 2B has a structure in which the layers of the EL layer illustrated in FIG. 1B are stacked in a reverse order, the light-emitting element illustrated in FIG. 2C has a structure in which the layers of the EL layer illustrated in FIG. 1C are stacked in a reverse order, and the light-emitting element illustrated in FIG. 2D has a structure in which the layers of the EL layer illustrated in FIG 1D are stacked in a reverse order.

In this embodiment mode, the light-emitting element is formed over a substrate formed of glass, plastics, or the like. By forming a plurality of such light-emitting elements over a substrate, a passive matrix light-emitting device can be manufactured. Moreover, the light-emitting element may be manufactured over an electrode electrically connected to, for example, a thin film transistor (TFT) formed over a substrate formed of glass, plastics, or the like. In this way, an active matrix light-emitting device can be manufactured, in which driving of the light-emitting element is controlled by a TFT. Note that there is no particular limitation on a structure of the TFT and a staggered TFT or an inverted staggered TFT may be employed. In addition, a driver circuit formed over a TFT substrate may include both an n-channel TFT and a p-channel TFT, or either an n-channel TFT or a p-channel TFT. In addition, there is no particular limitation on the crystallinity of a semiconductor film used for the TFT, and either an amorphous semiconductor film or a crystalline semiconductor film may be used. Alternatively, a single crystal semiconductor film may be used. The single crystal semiconductor film can be formed by a Smart Cut (registered trademark) method.

As described above, the light-emitting element described in this embodiment mode has a feature that both the layer 212 for controlling the hole transport and the layer 215 for controlling the electron transport are provided.

For example, in a conventional light-emitting element in which the layer 212 for controlling the bole transport and the layer 215 for controlling the electron transport are not provided, holes injected from the first electrode 202 pass through the hole-injecting layer 211 and the hole-transporting layer 213 and are injected to the light-emitting layer 214 while keeping the transporting rate; thus, some holes reach a region around the interface between the electron-transporting layer 216 and the light-emitting layer 214. When the holes reach the electron-transporting layer 216, the electron-transporting layer 216 could possibly be deteriorated. When the amount of holes which reach the electron-transporting layer 216 is increased with time due to deterioration of the electron-transporting layer 216, the recombination probability in the light-emitting layer 214 is reduced with time, which results in reduction in element lifetime (luminance decay with time). In a similar manner, the electrons injected from the second electrode 204 pass through the electron-injecting layer 217 and the electron-transporting layer 216 and are injected to the light-emitting layer 214 while keeping the transporting rate; thus, some electrons reach a region around the interface between the hole-transporting layer 213 and the light-emitting layer 214. When the electrons reach the hole-transporting layer 213, the hole-transporting layer 213 could possibly be deteriorated. When the amount of electrons which reach the hole-transporting layer 213 is increased with time due to deterioration of the hole-transporting layer 213, the recombination probability in the light-emitting layer 214 is reduced with time, which results in reduction in element lifetime (luminance decay with time).

In the light-emitting element of the present invention, by provision of the layer 212 for controlling the hole transport, holes injected from the first electrode 202 pass through the hole-injecting layer 211, and are injected to the layer 212 for controlling the hole transport. The transporting rate of the holes injected to the layer 212 for controlling the hole transport is lowered, and the hole injection to the hole-transporting layer 213 is controlled. Therefore, the hole injection to the light-emitting layer 214 is also controlled. As a result, the holes become less likely to reach the electron-transporting layer 216 and deteriorate the electron-transporting layer 216. It is important in the present invention that an organic compound with a hole-transporting property is added with an organic compound which degrades the hole-transporting property, instead of just applying a substance with low hole mobility, for the layer 212 for controlling the hole transport. In this manner, such a structure not only controls hole injection to the light-emitting layer but also suppresses the quantity of controlled hole injection changing with time.

Further, in the light-emitting element of the present invention, the layer 215 for controlling the electron transport is also provided. Accordingly, electrons injected from the second electrode 204 pass through the electron-injecting layer 217 and the electron-transporting layer 216, and are injected to the layer 215 for controlling the electron transport. Here, the layer 215 for controlling the electron transport has a structure in which the fourth organic compound with a hole-transporting property is added to the third organic compound with an electron-transporting property. Therefore, the transporting rate of the electrons that are injected to the layer 215 for controlling the electron transport is decreased and the electron injection to the light-emitting layer 214 is controlled. Consequently, electrons become less likely to reach the hole-transporting layer 213 and deteriorate the hole-transporting layer 213. Similarly, as for holes, holes become less likely to reach the electron-transporting layer 216 and deteriorate the electron-transporting layer 216 because the layer 215 for controlling the electron transport contains the third organic compound with an electron-transporting property. Furthermore, it is important in the present invention that an organic compound with a hole-transporting property is added to an organic compound with an electron-transporting property, instead of just employing a substance with low electron mobility, for the layer 215 for controlling the electron transport. In this manner, such a structure not only controls the electron injection to the light-emitting layer 214 but also suppresses the quantity of controlled electron injection changing with time.

Therefore, the light-emitting element of the present invention can prevent a phenomenon that carrier balance is decreased with time and the recombination probability is lowered, by controlling the injection amount of both types of carriers, holes and electrons, to the light-emitting layer. Thus, the lifetime of the element can be improved (luminance decay with time can be suppressed).

Furthermore, by providing the layer 212 for controlling the hole transport, light emission efficiency can be improved. In the case of a conventional element structure in which the layer 212 for controlling the hole transport is not provided, a large part of holes injected from the first electrode 202 are injected to the light-emitting layer 214 without the transport being controlled. When the light-emitting layer 214 has an electron-transporting property, that is, a material with the highest percent in the light-emitting layer 214 has an electron-transporting property, a light-emitting region is formed around the interface between the light-emitting layer 214 and the hole-transporting layer 213. However, around the interface between the light-emitting layer 214 and the hole-transporting layer 213, there is a possibility that cations are generated due to excessive holes. Since the cations function as a quencher, light emission efficiency is lowered by the influence of the cations generated around the light-emitting region.

However, by providing the layer 212 for controlling the hole transport described in this embodiment mode, generation of cations around the light-emitting layer 214 and the hole-transporting layer 213 due to excessive holes can be suppressed, so that reduction in light emission efficiency can be suppressed. Therefore, a light-emitting element with high light emission efficiency can be obtained.

As described above, the light-emitting element described in this embodiment mode includes the layer for controlling the carrier transport. The layer for controlling the carrier transport contains at least two kinds of substances. Therefore, by controlling a combination of the substances, a mixture ratio thereof, the thickness of the layer, and the like, carrier balance can be precisely controlled.

Since the carrier balance can be controlled by control of a combination of the substances, a mixture ratio thereof, the thickness of the layer, and the like, control of carrier balance can be easier than the conventional technique. That is, even if a physical property of the substance is not changed, the carrier transport can be controlled by a mixture ratio of the substances, the thickness of the layer, and the like.

The carrier transport is controlled using the organic compound whose weight percent is low among two or more kinds of substances contained in the layer for controlling the carrier transport. That is, since the carrier transport can be controlled by a component whose weight percent is low among components contained in the layer for controlling the carrier transport, the light-emitting element hardly deteriorates with time and can have long lifetime. That is, carrier balance hardly changes compared to the case where carrier balance is controlled by a single substance. For example, when the carrier transport is controlled by a layer formed of a single substance, the carrier balance of the whole layer is changed by a partial change in morphology, partial crystallization, or the like. Therefore, the light-emitting element easily deteriorates with time. However, as shown in this embodiment mode, when the carrier transport is controlled by a component whose weight percent is low among the components contained in the layer for controlling the carrier transport, an influence of a change in morphology, crystallization, aggregation, or the like is reduced, and thus, deterioration with time is hardly caused. Therefore, a long-lifetime light-emitting element in which carrier balance is hardly lowered with time and light emission efficiency will not easily decrease with time can be obtained.

In this embodiment mode, the layer for controlling the hole transport is provided between the light-emitting layer and the first electrode functioning as an anode, and the layer for controlling the electron transport is provided between the light-emitting layer and the second electrode functioning as a cathode. With such a structure, carriers are recombined on opposite sides of the light-emitting layer at portions apart from the electrodes, which is preferable.

In addition, the carrier transport is controlled on opposite sides of the light-emitting layer, whereby the influence of a change in morphology, crystallization, aggregation, or the like can be further reduced, and a long-lifetime light-emitting element which hardly deteriorates with time and whose light emission efficiency is not easily decreased with time can be obtained.

In addition, by controlling the carrier transport on opposite sides of the light-emitting layer, a long-lifetime light-emitting element can be achieved, which is not affected by a carrier-transporting property of the light-emitting layer. Therefore, a material for the light-emitting layer can be chosen from a wider range, and the light-emitting element can be designed more flexibly.

Note that this embodiment mode can be combined with other embodiment modes as appropriate.

(Embodiment Mode 2)

This embodiment mode will describe the case where a layer having a different structure from that described in Embodiment Mode 1 is used for the layer for controlling the electron transport. Except for the layer for controlling the electron transport, the structure described in Embodiment Mode 1 can be used.

The layer 215 for controlling the electron transport described in this embodiment mode contains a third organic compound and a fourth organic compound, and the weight percent of the third organic compound is higher than that of the fourth organic compound. That is, the fourth organic compound is dispersed in the third organic compound. In addition, the layer for controlling the electron transport is preferably provided between the light-emitting layer 214 and the second electrode 204.

In the case where the layer for controlling the electron transport is provided between the light-emitting layer and the second electrode functioning as a cathode, the third organic compound is preferably an organic compound with an electron-transporting property. That is, the third organic compound is preferably a substance whose electron-transporting property is higher than the hole-transporting property.

On the other hand, the fourth organic compound is preferably an organic compound having a function of trapping electrons. That is, the fourth organic compound is preferably an organic compound having a lowest unoccupied molecular orbital (LUMO) level which is lower than that of the third organic compound by 0.3 eV or more.

By the layer 215 for controlling the electron transport containing the fourth organic compound, the electron-transporting rate of the whole layer is lower than in the case where this layer is made of only the third organic compound. In other words, by addition of the fourth organic compound, the carrier transport can be controlled. Further, by controlling the concentration of the fourth organic compound, the carrier transporting rate can be controlled. The concentration of the fourth organic compound is preferably in the range of 0.1 wt % to 5 wt % or in the rage of 0.1 mol % to 5 mol %.

Figure 6:
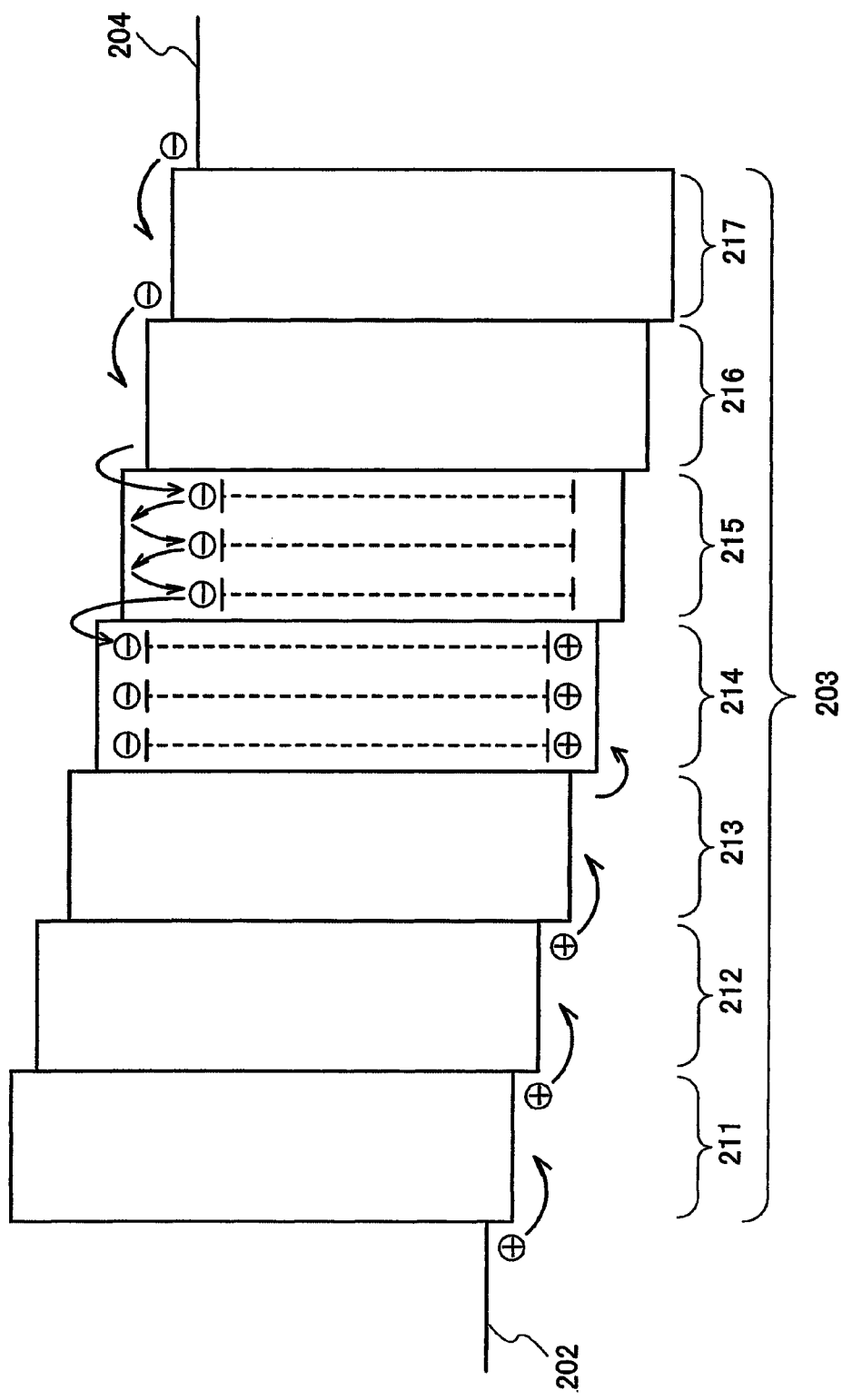
FIG. 6 illustrates a light-emitting element of the present invention.

FIG. 6 is an example of a band diagram of the light-emitting element of the present invention illustrated in FIG. 1A. In FIG. 6, holes injected from the first electrode 202 pass through the hole-injecting layer 211, the layer 212 for controlling the hole transport, and the hole transporting layer 213, and are injected to the light-emitting layer 214. Then, electrons injected from the second electrode 204 pass through the electron-injecting layer 217 and the electron-transporting layer 216, and are injected to the layer 215 for controlling the electron transport. The transporting rate of the electrons injected to the layer for controlling the electron transport is decreased by the fourth organic compound having an electron-trapping property. The electrons whose transporting rate has been decreased are injected to the light-emitting layer 214, and then recombined with holes. In this manner, light emission is obtained.

In a conventional element structure in which the layer for controlling the electron transport is not provided, electrons injected from the second electrode pass through the electron-injecting layer and the electron transporting layer, and are injected to the light-emitting layer. If the light-emitting layer has an electron-transporting property, that is, a material with the highest weight percent in the light-emitting layer has an electron transporting property, the electrons injected to the light-emitting layer could be transported through the light-emitting layer and could reach the hole-transporting layer. The electrons which have reached the hole-transporting layer could deteriorate a material contained in the hole-transporting layer, which leads to deterioration of the light-emitting element.

However, by providing the layer for controlling the electron transport described in this embodiment mode, electrons passing through the light-emitting layer to reach the hole-transporting layer can be suppressed, and thus, deterioration of the hole-transporting layer due to the electrons which have reached the hole-transporting layer can be suppressed. Accordingly, deterioration of the light-emitting element can be suppressed, and the light-emitting element can have long lifetime.

In this embodiment mode, it is preferable that the emission colors of the light-emitting layer and the fourth organic compound be similar colors. For example, when the organic compound contained in the light-emitting layer is an organic compound which exhibits bluish light emission such as YGA2S or YGAPA, the fourth organic compound is preferably a substance which exhibits light emission in the range of blue to bluish green such as acridone, coumarin 102, coumarin 6H, coumarin 480D, or coumarin 30. In this manner, even if the fourth organic compound emits light unintentionally, the color purity of light emitted from the light-emitting element can be in a good condition.

Further, when the organic compound contained in the light-emitting layer is an organic compound which exhibits greenish light emission such as 2PCAPA, 2PCABPhA, 2DPAPA, 2DPABPhA, 2YGABPhA, or DPhAPhA, the fourth organic compound is preferably a substance which exhibits light emission in the range of bluish green to yellowish green such as N,N'-dimethylquinacridone (abbreviation: DMQd), N,N'-diphenylquinacridone (abbreviation: DPQd), 9,18-dihydrobenzo[h]benzo[7,8]quino[2,3-b]acridine-7,16-dione (abbreviation: DMNQd-1), 9,18-dihydro-9,18-dihydrobenzo[h]benzo[7,8]quino[2,3-b]acridine-7,16-dione (abbreviation: DMNQd-2), cumarin 30, cumarin 6, cumarin 545T, or cumarin 153.

Further, when the organic compound contained in the light-emitting layer is an organic compound which exhibits yellowish light emission such as rubrene or BPT, the fourth organic compound is preferably a substance which exhibits light emission in the range of yellowish green to golden yellow such as DMQd or (2-{2-[4-(9H-carbazol-9-yl)phenyl]ethenyl}-6-methyl-4H-pyran-4-ylidene)propanedinitrile (abbreviation: DCMCz).

Further, when the organic compound contained in the light-emitting layer is an organic compound which exhibits reddish light emission such as p-mPhTD or p-mPhAFD, the fourth organic compound is preferably a substance which exhibits light emission in the range of orange to red such as 2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), or Nile red.

Further, when the light-emitting material contained in the light-emitting layer is a phosphorescent compound, the fourth organic compound is also preferably a phosphorescent compound. For example, when the light-emitting material is the above-described $Ir(btp)_2(acac)$ which exhibits reddish light emission, the fourth organic compound may be a red phosphorescent compound such as (acetylacetonato)bis[2,3-bis(4-fluorophenyl)quinoxalinato]iridium(III) (abbreviation: $Ir(Fdpq)_2(acac)$). Note that the above-described compounds are compounds having low LUMO levels among compounds that are used for light-emitting elements. Thus, by adding such compounds to the third organic compound which will be described later, an excellent electron-trapping property can be obtained.

Among the above substances listed for the fourth organic compound, quinacridone derivatives such as DMQd, DPQd, DMNQd-1, and DMNQd-2 are chemically stable and thus preferable. That is, by applying quinacridone derivatives, the lifetime of the light-emitting element can be especially longer. Further, since quinacridone derivatives exhibit greenish light emission, the element structure of the light-emitting element described in this embodiment mode is especially effective for a light-emitting element exhibiting greenish light emission. A green color requires the highest level of luminance in forming a full-color display, and there are cases where the deterioration speed of a green light-emitting element is faster than those of other light-emitting elements. However, such a problem can be overcome by applying the present invention.

Note that the fourth organic compound is preferably a coumarin derivative such as coumarin 102, coumarin 6H, coumarin 480D, coumarin 30, coumarin 6, coumarin 545T, or coumarin 153. Coumarin derivatives have low electron-trapping properties. Therefore, the concentration of the fourth organic compound added to the third organic compound may be relatively high. That is, the concentration of the fourth organic compound can easily be controlled, and thus, a layer for controlling the electron transport which has desired properties can be obtained. Further, since coumarin derivatives have high light emission efficiency, decrease in light emission efficiency of the entire light-emitting element can be suppressed when the fourth organic compound emits light.

In addition, the third organic compound contained in the layer 215 for controlling the electron transport is an organic compound with an electron-transporting property. That is, the third organic compound is a substance whose electron-transporting property is higher than the hole-transporting property. Specifically, the following can be used: metal complexes such as Alq, $Almq_3$, $BeBq_2$, BAlq, Znq, BAlq, ZnPBO, and ZnBTZ; heterocyclic compounds such as PBD, OXD-7, TAZ, TPBI, BPhen, and BCP; and condensed aromatic compounds such as CzPA, DPCzPA, DPPA, DNA, t-BuDNA, BANT, DPNS, DPNS2, and TPB3.

Further, the following high-molecular compounds can also be used: poly[(9,9-dihexylfluorene-2,7-diyl)-co-(pyridine-3, 5-diyl)] (abbreviation: PF-Py) and poly[(9,9-dioctyllfluorene-2,7-diyl)-co-(2,2'-bipyridine-6,6'-diyl)] (abbreviation: PF-BPy). Above all, metal complexes that are stable against electrons are preferably used.

As described above, the LUMO level of the fourth organic compound is preferably lower than that of the first organic compound by 0.3 eV or more. Therefore, a substance for the third organic compound may be selected as appropriate so as to satisfy such a condition, according to the kind of the fourth organic compound. For example, when DPQd or coumarin 6 is used for the fourth organic compound, the above condition can be satisfied by using Alq for the third organic compound.

In addition, it is preferable that the emission colors of the fourth organic compound contained in the layer 215 for controlling the electron transport and the substance with a high light-emitting property contained in the light-emitting layer 214 be similar colors. Specifically, it is preferable that a difference between a peak value of the emission spectrum of the fourth organic compound and that of the substance with a high light-emitting property be within 30 nm. With the difference within 30 nm, the emission color of the fourth organic compound and the emission color of the substance with a high light-emitting property can be similar colors. Accordingly, even in the case where the fourth organic compound emits light due to change in voltage or the like, change in emission color of the light-emitting element can be suppressed.

The fourth organic compound does not always need to emit light. For example, in the case where light emission efficiency of the substance with a high light-emitting property is higher than that of the fourth organic compound, the concentration of the fourth organic compound in the layer 215 for controlling the electron transport is preferably adjusted so that only light emitted from the substance with a high light-emitting property is substantially obtained (the concentration is slightly lowered so that light emission from the fourth organic compound is suppressed). In this case, since the emission colors of the substance with a high light-emitting property and the fourth organic compound are similar colors (that is, the substance with a high light-emitting property and the fourth organic compound have substantially the same energy gap), energy transfer from the substance with a high light-emitting property to the fourth organic compound does not easily occur, and thus, high light emission efficiency is obtained.

In addition, the thickness of the layer 215 for controlling the electron transport is preferably greater than or equal to 5 nm and less than or equal to 20 nm. When the layer 215 for controlling the electron transport is too thick, the carrier transporting rate becomes too low, which could result in high driving voltage. When the layer 215 for controlling the electron transport is too thin, on the other hand, it is impossible to achieve the function of controlling the carrier transport. Therefore, the thickness of the layer 215 for controlling the electron transport is preferably greater than or equal to 5 nm and less than or equal to 20 nm.

In addition, the layer for controlling the electron transport described in this embodiment mode is preferably provided to be in contact with the light-emitting layer as in Embodiment Mode 1. By providing the layer for controlling the electron transport to be in contact with the light-emitting layer, electron injection to the light-emitting layer can be directly controlled. Therefore, a change in carrier balance with time in the light-emitting layer can be suppressed more efficiently, whereby a greater effect of improving the lifetime of the element can be obtained. In addition, the process can be simplified.

Note that the layer for controlling the electron transport is preferably provided so as to be in contact with the light-emitting layer, and in such a case, the types of the third organic compound contained in the layer for controlling the electron transport and an organic compound with a high weight percent in the light-emitting layer are preferably different from each other. In particular, in the case where the light-emitting layer contains a substance (fifth organic compound) in which a substance with a high light-emitting property is dispersed and the substance with a high light-emitting property (sixth organic compound), the types of the fifth organic compound and the third organic compound are preferably different from each other. With such a structure, the electron transport from the layer for controlling the electron transport to the light-emitting layer can be suppressed between the third organic compound and the fifth organic compound. Thus, the advantageous effect obtained by providing the layer for controlling the electron transport can be further increased.

As described above, the light-emitting element described in this embodiment mode has a feature that both the layer 212 for controlling the hole transport and the layer 215 for controlling the electron transport are provided.

For example, in a conventional light-emitting element in which the layer 212 for controlling the hole transport and the layer 215 for controlling the electron transport are not provided, holes injected from the first electrode 202 pass through the hole-injecting layer 211 and the hole-transporting layer 213 and are injected to the light-emitting layer 214 while keeping the transporting rate; thus, some holes reach a region around the interface between the electron-transporting layer 216 and the light-emitting layer 214. When the holes reach the electron-transporting layer 216, the electron-transporting layer 216 could possibly be deteriorated. When the amount of holes which reach the electron-transporting layer 216 is increased with time due to deterioration of the electron-transporting layer 216, the recombination probability in the light-emitting layer 214 is reduced with time, which results in reduction in element lifetime (luminance decay with time). In a similar manner, the electrons injected from the second electrode 204 pass through the electron-injecting layer 217 and the electron-transporting layer 216 and are injected to the light-emitting layer 214 while keeping the transporting rate; thus, some electrons reach a region around the interface between the hole-transporting layer 213 and the light-emitting layer 214. When the electrons reach the hole-transporting layer 213, the hole-transporting layer 213 could possibly be deteriorated. When the amount of electrons which reach the hole-transporting layer 213 is increased with time due to deterioration of the hole-transporting layer 213, the recombination probability in the light-emitting layer 214 is reduced with time, which results in reduction in element lifetime (luminance decay with time).

On the other hand, in the light-emitting element of the present invention, by providing the layer 212 for controlling the hole transport, holes injected from the first electrode 202 pass through the hole-injecting layer 211, and are injected to the layer 212 for controlling the hole transport. The transporting rate of the holes injected to the layer 212 for controlling the hole transport is decreased, and the hole injection to the hole-transporting layer 213 is controlled. Therefore, the hole injection to the light-emitting layer 214 is also controlled. As a result, holes become less likely to reach and deteriorate the electron-transporting layer 216. It is important in the present invention that an organic compound with a hole-transporting property is added with an organic compound which degrades the hole-transporting property, instead of just applying a substance with low hole mobility, for the layer 212 for controlling the hole transport. In this manner, such a structure not only controls hole injection to the light-emitting layer but also suppresses the quantity of controlled hole injection changing with time.

Further, in the light-emitting element of the present invention, the layer 215 for controlling the electron transport is also provided. Accordingly, electrons injected from the second electrode 204 pass through the electron-injecting layer 217 and the electron-transporting layer 216, and are injected to the layer 215 for controlling the electron transport. Here, the layer 215 for controlling the electron transport has a structure in which the fourth organic compound having a function of trapping electrons is added to the third organic compound with an electron-transporting property. Therefore, the transporting rate of the electrons that are injected to the layer 215 for controlling the electron transport is decreased and the electron injection to the light-emitting layer 214 is controlled. Therefore, electrons become less likely to reach the hole-transporting layer 213 and deteriorate the hole-transporting layer 213. Similarly, as for holes, holes become much less likely to reach and deteriorate the electron-transporting layer 216 because the layer 215 for controlling the electron transport contains the third organic compound with an electron-transporting property. It is important in the present invention that an organic compound with an electron-trapping property is added to an organic compound with an electron-transporting property, instead of just applying a substance with low electron mobility, for the layer 215 for controlling the electron transport. In this manner, such a structure not only controls electron injection to the light-emitting layer 214 but also suppresses the quantity of controlled electron injection changing with time.

Therefore, the light-emitting element of the present invention can prevent a phenomenon that carrier balance is deteriorated with time and the recombination probability is lowered, by controlling the injection amount of both carriers, holes and electrons, to the light-emitting layer. Thus, the lifetime of the element can be improved (luminance decay with time can be suppressed).

Furthermore, by providing the layer 212 for controlling the hole transport, light emission efficiency can be improved. In the case of a conventional element structure in which the layer 212 for controlling the hole transport is not provided, a large part of holes injected from the first electrode 202 are injected to the light-emitting layer 214 without the transport being controlled. When the light-emitting layer 214 has an electron-transporting property, that is, a material with the highest percent in the light-emitting layer 214 has an electron-transporting property, a light-emitting region is formed around the interface between the light-emitting layer 214 and the hole-transporting layer 213. However, around the interface between the light-emitting layer 214 and the hole-transporting layer 213, there is a possibility that cations are generated due to excessive holes. Since the cations function as a quencher, light emission efficiency is lowered by the influence of the cations generated around the light-emitting region.

However, by providing the layer 212 for controlling the hole transport described in this embodiment mode, generation of cations around the light-emitting layer 214 and the hole-transporting layer 213 due to excessive holes can be suppressed, so that reduction in light emission efficiency can be suppressed. Therefore, a light-emitting element with high light emission efficiency can be obtained.

As described above, the light-emitting element described in this embodiment mode includes the layer for controlling the carrier transport. The layer for controlling the carrier transport contains at least two kinds of substances. Therefore, by controlling a combination and a mixture ratio of the substances, the thickness of the layer, and the like, carrier balance can be precisely controlled.

Since the carrier balance can be controlled by control of a combination and a mixture ratio of the substances, the thickness of the layer, and the like, control of carrier balance can be easier than the conventional technique. That is, even if a physical property of the substance used is not changed, the carrier transport can be controlled by control of a mixture ratio of the substances, the thickness of the layer, and the like.

The carrier transport is controlled using the organic compound whose weight percent is low among two or more kinds of substances contained in the layer for controlling the carrier transport. That is, since the carrier transport can be controlled by a component whose weight percent is low among components contained in the layer for controlling the carrier transport, the light-emitting element hardly deteriorates with time, and the long lifetime of the light-emitting element can be realized. That is, change in carrier balance is hardly caused compared to the case where carrier balance is controlled by a single substance. For example, when the carrier transport is controlled by a layer formed of a single substance, the carrier balance of the whole layer is changed by a partial change in morphology, partial crystallization, or the like. Therefore, the light-emitting element easily deteriorates with time. However, as described in this embodiment mode, by controlling the carrier transport by a component whose weight percent is low among the components included in the layer for controlling the carrier transport, an influence of change in morphology, crystallization, aggregation, or the like is reduced, and thus deterioration with time is hardly caused. Thus, a light-emitting element with long lifetime, in which light emission efficiency is hardly reduced with time, can be obtained.

In addition, in this embodiment mode, the layer for controlling the hole transport is provided between the light-emitting layer and the first electrode functioning as an anode, and the layer for controlling the electron transport is provided between the light-emitting layer and the second electrode functioning as a cathode. With such a structure, carriers are recombined at portions apart from the electrodes on opposite sides of the light-emitting layer, which is preferable.

Also, by controlling the carrier transport on opposite sides of the light-emitting layer, an influence of change in morphology, crystallization, aggregation, or the like can be further reduced, and deterioration with time is hardly caused. Thus, a long-lifetime light-emitting element, in which light emission efficiency is hardly reduced with time, can be obtained.

In addition, by controlling the carrier transport on opposite sides of the light-emitting layer, a long-lifetime light-emitting element can be achieved, which is not affected by a carrier-transporting property of the light-emitting layer. Therefore, a material for the light-emitting layer can be chosen from a wider range, and the light-emitting element can be designed more flexibly.

Note that this embodiment mode can be combined with other embodiment modes as appropriate.

(Embodiment Mode 3)

In this embodiment mode, a light-emitting element in which a plurality of light-emitting units according to the present invention are stacked (hereinafter, referred to as a stacked type element) will be described with reference to FIG. 7. The light-emitting element is a stacked-type light-emitting element including a plurality of light-emitting units between a first electrode and a second electrode. A structure similar to that described in Embodiment Modes 1 and 2 can be used for each light-emitting unit. In other words, the light-emitting element described in Embodiment Mode 2 is a light-emitting element having one light-emitting unit. In this embodiment mode, a light-emitting element having a plurality of light-emitting units will be described.

Figure 7:
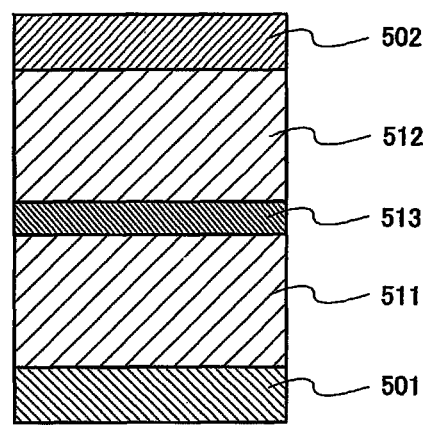
FIG. 7 illustrates a light-emitting element of the present invention.

In FIG. 7, a first light-emitting unit 511 and a second light-emitting unit 512 are stacked between a first electrode 501 and a second electrode 502. As the first electrode 501 and the second electrode 502, an electrode similar to that described in Embodiment Mode 1 can be applied. The first light-emitting unit 511 and the second light-emitting unit 512 may have either the same structure or different structures, which may be similar to that described in Embodiment Mode 1 or 2.

A charge generation layer 513 is formed using a composite material of an organic compound and a substance with an acceptor property. The composite material of an organic compound and a substance with an acceptor property is described in Embodiment Mode 1 and contains, as a substance with an acceptor property, 7,7,8,8-tetracyano-2,3,5,6-tetrafluoro-quinodimethane (abbreviation: $F_4$-TCNQ) or a metal oxide such as vanadium oxide, molybdenum oxide, or tungsten oxide. As the organic compound, various compounds such as an aromatic amine compound, a carbazole derivative, aromatic hydrocarbon, a high-molecular compound, oligomer, dendrimer, and polymer can be used. The compound having a hole mobility of greater than or equal to $10^{-6}$ cm$^2$/Vs is preferably used as the organic compound. However, other substances may also be used as long as their hole-transporting properties are higher than their electron-transporting properties. Since the complex of an organic compound and a metal oxide has an excellent carrier-injecting property and an excellent carrier-transporting property, low voltage drive and low current drive can be realized.

Note that the charge generation layer 513 may be formed by a combination of the composite material of an organic compound and a substance with an acceptor property, and other materials. For example, a layer containing a composite material of an organic compound and a metal oxide may be combined with a layer containing a compound of a substance selected from substances with an electron-donating property and a compound with a high electron-transporting property. Further, the charge generation layer 513 may be formed with a combination of a layer containing the composite material of an organic compound and a metal oxide, and a transparent conductive film. In addition, electrode materials described in Embodiment Mode 1 can also be used for the charge generation layer. It is preferable that the charge generation layer be a highly light-transmitting layer so that light extraction efficiency is increased.

In any case, it is acceptable as long as the charge generation layer 513 interposed between the first light-emitting unit 511 and the second light-emitting unit 512 injects electrons to a light-emitting unit on one side and holes to a light-emitting unit on the other side when voltage is applied to the first electrode 501 and the second electrode 502. For example, in the case of applying voltage such that the potential of the first electrode is higher than that of the second electrode, any structure is acceptable for the charge generation layer 513 as long as the charge generation layer 513 injects electrons to the first light-emitting unit 511 and holes to the second light-emitting unit 512.

Although this embodiment mode describes the light-emitting element having two light-emitting units, the present invention can be similarly applied to a light-emitting element in which three or more light-emitting units are stacked. Arrangement of a plurality of light-emitting units that are partitioned by a charge generation layer between a pair of electrodes, as in the light-emitting element of this embodiment mode, can realize an element having long lifetime in a high-luminance region, while keeping current density low. In addition, in the case where the light-emitting element is applied to a lighting system, for example, uniform light emission in a large area is possible because voltage drop due to resistance of an electrode material can be reduced. Moreover, a light-emitting device of low power consumption, which can be driven at low voltage, can be achieved.

By forming light-emitting units to have different emission colors, light emission of a desired color can be obtained as a whole light-emitting element. For example, in the light-emitting element having two light-emitting units, when the emission colors of the first light-emitting unit and the second light-emitting unit are complementary colors, a light-emitting element which emits white light as a whole can be obtained. Note that "complementary color" means a relation between colors which becomes an achromatic color when they are mixed. That is, white light emission can be obtained by mixture of light from substances whose emission colors are complementary colors. The same can be said for a light-emitting element having three light-emitting units. For example, white light emission can be obtained from the light-emitting element as a whole when emission colors of the first, second, and third light-emitting units are red, green, and blue, respectively.

Note that this embodiment mode can be combined with other embodiment modes as appropriate.

(Embodiment Mode 4)

This embodiment mode will describe a light-emitting device including the light-emitting element of the present invention.

Figure 8A:
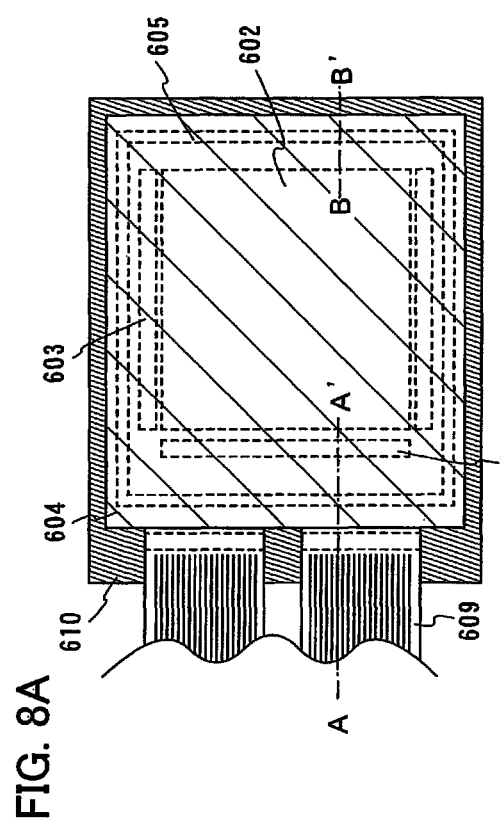
FIGS. 8A and 8B illustrate a light-emitting device of the present invention.
Figure 8B:
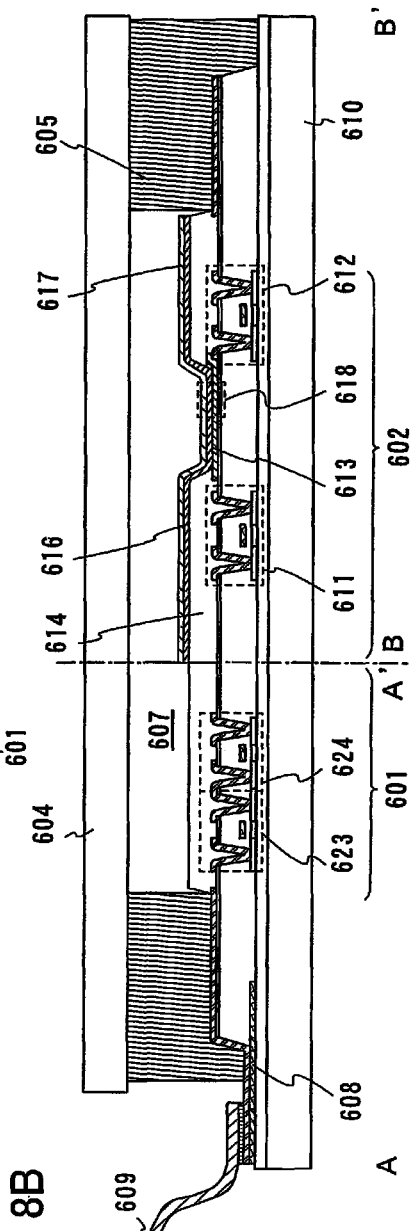

A light-emitting device having the light-emitting element of the prevent invention in a pixel portion will be described in this embodiment mode with reference to FIGS. 8A and 8B. FIG. 8A is a top view illustrating the light-emitting device and FIG. 8B is a cross-sectional view along a line A-A' and a line B-B' of FIG. 8A. The light-emitting device includes a driver circuit portion (source-side driver circuit) 601, a pixel portion 602, and a driver circuit portion (gate-side driver circuit) 603 which are illustrated with dotted lines, for controlling light emission of the light-emitting element. Further, reference numeral 604 denotes a sealing substrate, reference numeral 605 denotes a sealant; and an area enclosed by the sealant 605 is a space 607.

A lead wiring 608 is a wiring for transmitting signals to be input to the source side driver circuit 601 and the gate side driver circuit 603, and the lead wiring 608 receives a video signal, a clock signal, a start signal, a reset signal, and the like from an FPC (flexible printed circuit) 609 that is an external input terminal. Although only the FPC is illustrated here, this FPC may be provided with a printed wiring board (PWB). The light-emitting device in this specification not only includes a light-emitting device itself but also a state where the light-emitting device has an FPC or a PWB attached thereto.

Next, a cross-sectional structure will be described with reference to FIG. 8B. The driver circuit portion and the pixel portion are formed over an element substrate 610. Here, the source side driver circuit 601 which is the driver circuit portion and one pixel in the pixel portion 602 are illustrated.

In the source side driver circuit 601, a CMOS circuit in which an n-channel TFT 623 and a p-channel TFT 624 are combined is formed. The driver circuit may also be formed with various CMOS circuits, PMOS circuits, or NMOS circuits. Furthermore, in this embodiment mode, a driver-integrated type structure in which the driver circuit is formed over the substrate is described, but a driver-integrated type structure is not necessarily required, and the driver circuit may be formed outside the substrate, not over the substrate.

The pixel portion 602 includes a plurality of pixels, each of which includes a switching TFT 611, a current control TFT 612, and a first electrode 613 which is electrically connected to a drain of the current control TFT 612. An insulator 614 is formed covering end portions of the first electrode 613. In this embodiment mode, the insulator 614 is formed using a positive photosensitive acrylic resin film.

In order to obtain favorable coverage, the insulator 614 is formed to have a curved surface with curvature at an upper edge portion or a lower edge portion. For example, in the case of using positive photosensitive acrylic as a material of the insulator 614, the insulator 614 is preferably formed to have a curved surface with a curvature radius (0.2 μm to 3 μm) only at an upper edge portion. As the insulator 614, either a negative type which becomes insoluble in etchant by irradiation with light or a positive type which becomes soluble in etchant by irradiation with light can be used.

An EL layer 616 and a second electrode 617 are formed over the first electrode 613. Various metals, alloys, electrically conductive compounds, and mixture thereof can be used for a material of the first electrode 613. When the first electrode functions as an anode, it is preferred that the first electrode be formed using a metal, an alloy, or an electrically conductive compound each having a high work function (a work function of greater than or equal to 4.0 eV), or a mixture thereof. For example, the first electrode 613 can be formed using a single layer film of an indium tin oxide film containing silicon, an indium zinc oxide film, a titanium nitride film, a chromium film, a tungsten film, a Zn film, a Pt film, or the like; or a stacked film, such as a stack of a titanium nitride film and a film containing aluminum as its main component or a three-layer structure of a titanium nitride film, a film containing aluminum as its main component, and a titanium nitride film. By employing a stacked structure, the electrode has a low resistance as a wiring, favorable ohmic contact can be obtained, and the electrode can function as an anode.

In addition, the EL layer 616 is formed by various methods such as an evaporation method using an evaporation mask, an ink-jet method, and a spin coating method. The EL layer 616 includes the layer for controlling the carrier transport described in Embodiment Modes 1 and 2. Any of low-molecular compounds, high-molecular compounds, oligomer, and dendrimer may be employed as the material used for forming the EL layer 616. As the material for the EL layer, not only an organic compound but also an inorganic compound may be used.

As a material for forming the second electrode 617, various metals, alloys, electrically conductive compounds, or a mixture of them can be used. When the second electrode functions as a cathode, it is preferred that the second electrode be formed using any of a metal, an alloy, and an electrically conductive compound each having a low work function (a work function of less than or equal to 3.8 eV), or a mixture thereof. For example, an element belonging to Group 1 or Group 2 of the periodic table, i.e., an alkali metal such as lithium (Li) or cesium (Cs), an alkaline earth metal such as magnesium (Mg), calcium (Ca), or strontium (Sr), or an alloy containing any of these (such as MgAg or AlLi), and the like can be given. If light generated in the EL layer 616 is transmitted through the second electrode 617, the second electrode 617 can be formed using a stack of a metal thin film and a transparent conductive film (indium tin oxide (ITO), indium tin oxide containing silicon or silicon oxide, indium zinc oxide (IZO), indium oxide containing tungsten oxide and zinc oxide (IWZO), or the like).

By attaching the sealing substrate 604 to the element substrate 610 with the sealant 605, a light-emitting element 618 is provided in the space 607 surrounded by the element substrate 610, the sealing substrate 604, and the sealant 605. Note that the space 607 is filled with a filler. There are cases where the space 607 may be filled with an inert gas (such as nitrogen or argon), or where the space 607 may be filled with the sealant 605.

Note that an epoxy-based resin is preferably used as the sealant 605. Further, preferably, these materials do not transmit moisture or oxygen as much as possible. As the sealing substrate 604, a plastic substrate formed of FRP (fiberglass-reinforced plastics), PVF (polyvinyl fluoride), polyester, acrylic, or the like can be used in addition to a glass substrate or a quartz substrate.

In such a manner, a light-emitting device including the light-emitting element of the present invention can be obtained.

A light-emitting device of the present invention includes the light-emitting element described in Embodiment Modes 1 to 3. Thus, a light-emitting device with high light emission efficiency can be obtained.

In addition, since the light-emitting device of the present invention includes the light-emitting element with high light emission efficiency, the light-emitting device can have low power consumption.

Furthermore, since the light-emitting device of the present invention has the long-lifetime light-emitting element which is hardly deteriorated, a long-lifetime light-emitting device can be obtained.

Figure 9A:
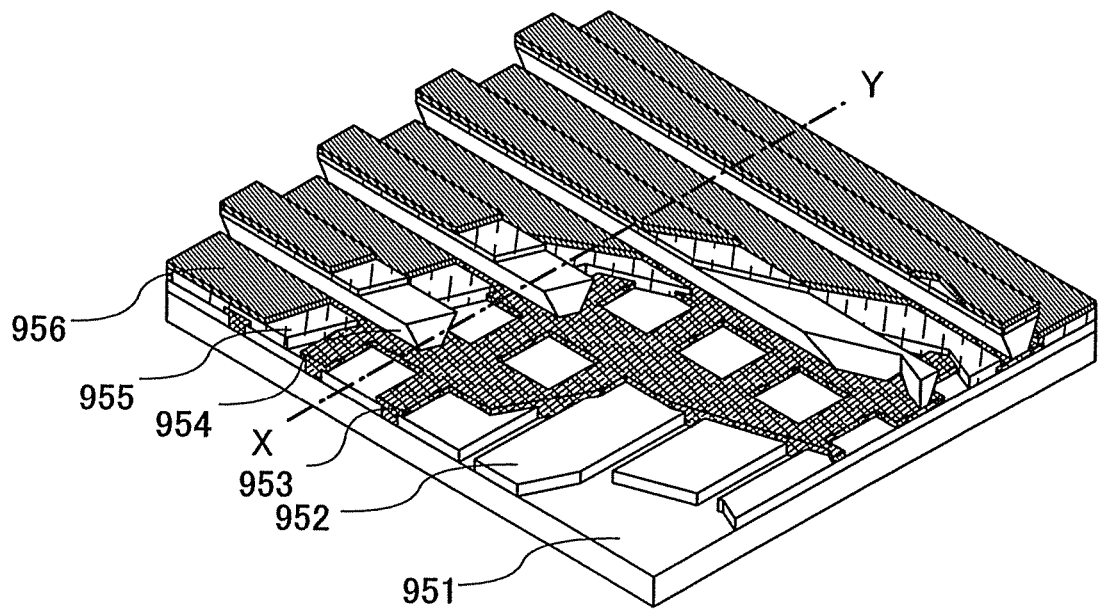
FIGS. 9A and 9B illustrate a light-emitting device of the present invention.
Figure 9B:
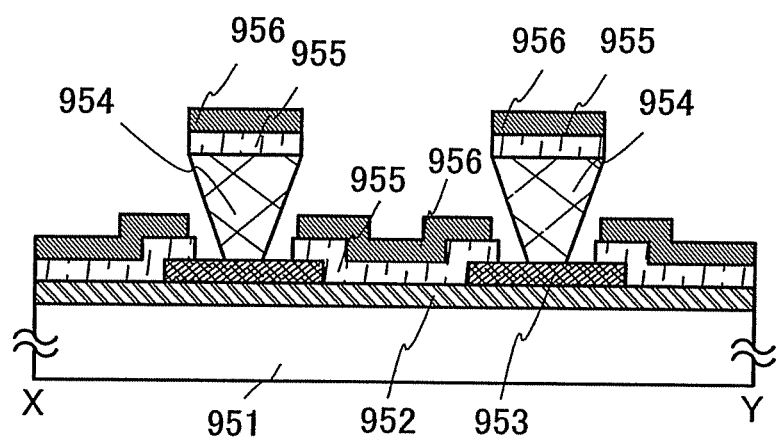

As described above, in this embodiment mode, an active matrix light-emitting device in which driving of a light-emitting element is controlled by a transistor is described. However, a passive matrix light-emitting device may also be used. A perspective view of a passive-matrix light-emitting device manufactured by applying the present invention is illustrated in FIG. 9A. FIG. 9A is a perspective view of a light-emitting device, and FIG. 9B is a cross-sectional view taken along a line X-Y of FIG. 9A. In FIGS. 9A and 9B, an EL layer 955 is provided between an electrode 952 and an electrode 956 over a substrate 951. An end portion of the electrode 952 is covered with an insulating layer 953. In addition, a partition layer 954 is provided over the insulating layer 953. A side wall of the partition layer 954 slopes so that a distance between one side wall and the other side wall becomes narrow toward a substrate surface. In other words, a cross section taken in the direction of the short side of the partition layer 954 is trapezoidal, and the lower side (a side in contact with the insulating layer 953, which is one of a pair of parallel sides of the trapezoidal cross section) is shorter than the upper side (a side not in contact with the insulating layer 953, which is the other one of the pair of parallel sides). Provision of the partition layer 954 in this manner allows patterning the cathode. In addition, when the light-emitting element with high light emission efficiency of the present invention is included in a passive matrix light-emitting device, a light-emitting device with high light emission efficiency can be obtained.

A light-emitting device of the present invention includes the light-emitting element described in Embodiment Modes 1 and 2. Thus, a light-emitting device with high light emission efficiency can be obtained.

In addition, since the light-emitting device of the present invention includes the light-emitting element with high light emission efficiency, the light-emitting device can have low power consumption.

Furthermore, since the light-emitting device of the present invention has the long-lifetime light-emitting element which is hardly deteriorated, a long-lifetime light-emitting device can be obtained.

Note that this embodiment mode can be combined with other embodiment modes as appropriate.

(Embodiment Mode 5)

This embodiment mode will describe an electronic device of the present invention which includes the light-emitting device described in Embodiment Mode 4 in a part thereof. An electronic device of the present invention has the light-emitting element described in Embodiment Modes 1 to 3 and a display portion with high light emission efficiency, low power consumption, and long lifetime.

As an electronic device which is manufactured using the light-emitting device of the present invention, the following devices are given: a camera such as a video camera or a digital camera, a goggle type display, a navigation system, an audio reproducing device (such as a car audio system or an audio component system), a computer, a game machine, a portable information terminal (such as a mobile computer, a cellular phone, a portable game machine, and an electronic book), an image reproducing device provided with a recording medium (specifically, a device which can reproduce a recording medium such as a digital versatile disc (DVD) and includes a display device capable of displaying the image), and the like. Specific examples of these electronic devices are illustrated in FIGS. 10A to 10D.

Figure 10A:
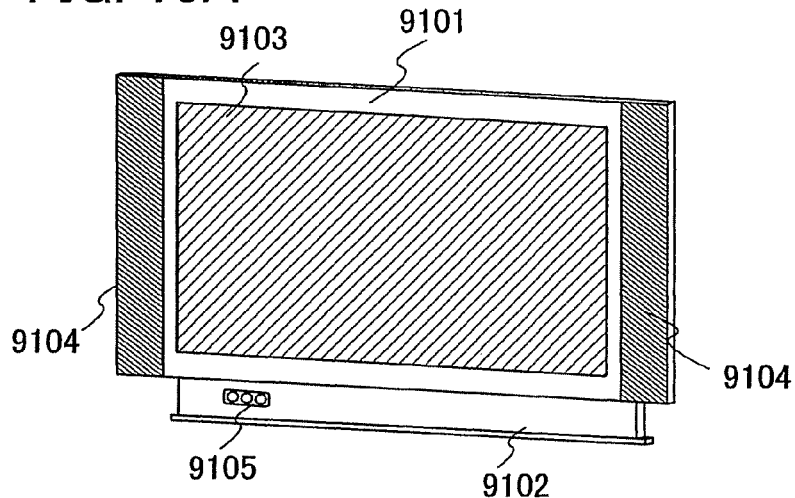
FIGS. 10A to 10D each illustrate an electronic device of the present invention.

FIG. 10A illustrates a television device according to this embodiment mode, which includes a chassis 9101, a support 9102, a display portion 9103, speaker portions 9104, a video input terminal 9105, and the like. In the display portion 9103 of this television device, light-emitting elements similar to those described in Embodiment Modes 1 and 2 are arranged in matrix. The light-emitting elements have features of high light emission efficiency, low power consumption, and long lifetime. Since the display portion 9103 including the light-emitting elements also has the similar features, this television device has less deterioration in image quality, and low power consumption is achieved. With such features, a deterioration compensation function and a power supply circuit can be significantly removed or reduced in the television device, thereby achieving reduction in size and weight of the chassis 9101 and the support 9102. In the television device of this embodiment mode, low power consumption, high image quality, and reduction in size and weight can be achieved, so that a television device which is suited to a living environment can be provided.

Figure 10B:
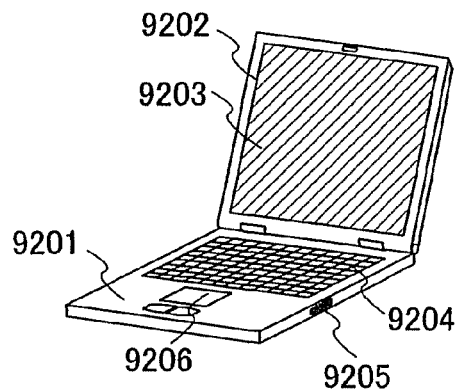

FIG. 10B illustrates a computer according to this embodiment mode and includes a main body 9201, a chassis 9202, a display portion 9203, a keyboard 9204, an external connection port 9205, a pointing device 9206, and the like. In the display portion 9203 of this computer, light-emitting elements similar to those described in Embodiment Mode 1 and 2 are arranged in matrix. The light-emitting elements have features of high light emission efficiency, low power consumption, and long lifetime. Since the display portion 9403 including the light-emitting elements also has the similar features, this computer has less deterioration in image quality, and low power consumption is achieved. With such features, a deterioration compensation function and a power supply circuit can be significantly removed or reduced in the computer, thereby achieving reduction in size and weight of the main body 9201 and the chassis 9202. In the computer of this embodiment mode, low power consumption, high image quality, and reduction in size and weight can be achieved, so that a computer which is suited to a living environment can be provided. Moreover, the computer can be carried around, and it is possible to provide a computer including a display portion that is able to withstand an impact from the outside when the computer is carried around.

Figure 10C:
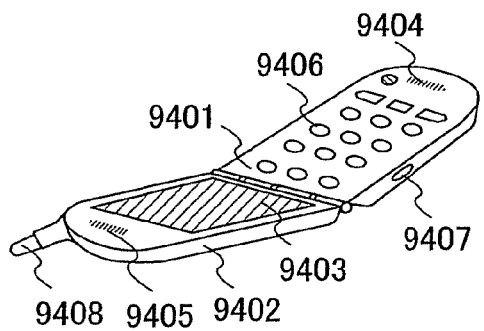

FIG. 10C illustrates a cellular phone according to this embodiment mode which includes a main body 9401, a chassis 9402, a display portion 9403, an audio input portion 9404, an audio output portion 9405, operation keys 9406, an external connection port 9407, an antenna 9408, and the like. In this cellular phone, the display portion 9403 includes light-emitting elements similar to those described in Embodiment Modes 1 and 2 arranged in matrix. The light-emitting elements have features of high light emission efficiency, low power consumption, and long lifetime. Since the display portion 9403 including the light-emitting elements also has the similar features, this cellular phone has less deterioration in image quality, and low power consumption is achieved. With such features, a deterioration compensation function and a power supply circuit can be significantly removed or reduced in the cellular phone, thereby achieving reduction in size and weight of the main body 9401 and the chassis 9402. In the cellular phone according to this embodiment mode, low power consumption, high image quality, and reduction in size and weight can be achieved, so that a cellular phone suitable for being carried around can be provided. Moreover, it is possible to provide a cellular phone including a display portion that is able to withstand an impact from the outside when the cellular phone is carried around.

Figure 10D:
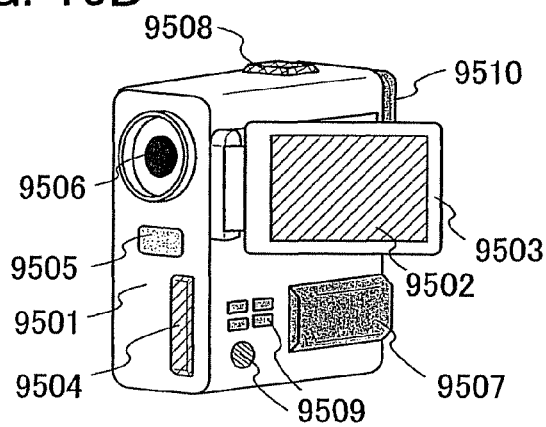

FIG. 10D illustrates a camera according to this embodiment mode, which includes a main body 9501, a display portion 9502, a chassis 9503, an external connection port 9504, a remote control receiving portion 9505, an image receiving portion 9506, a battery 9507, an audio input portion 9508, an operation key 9509, an eyepiece portion 9510, and the like. In this camera, the display portion 9502 includes light-emitting elements similar to those described in Embodiment Modes 1 and 2 arranged in matrix. The light-emitting elements have features of high light emission efficiency, low power consumption, and long lifetime. Since the display portion 9502 including the light-emitting elements also has the similar features, this camera has less deterioration in image quality, and low power consumption is achieved. With such features, a deterioration compensation function and a power supply circuit can be significantly removed or reduced in the camera, thereby achieving reduction in size and weight of the main body 9501. In the camera according to this embodiment mode, low power consumption, high image quality, and reduction in size and weight can be achieved, so that a camera suitable for being carried around can be provided. Moreover, it is possible to provide a camera including a display portion that is able to withstand an impact from the outside when the camera is carried around.

Figure 11:
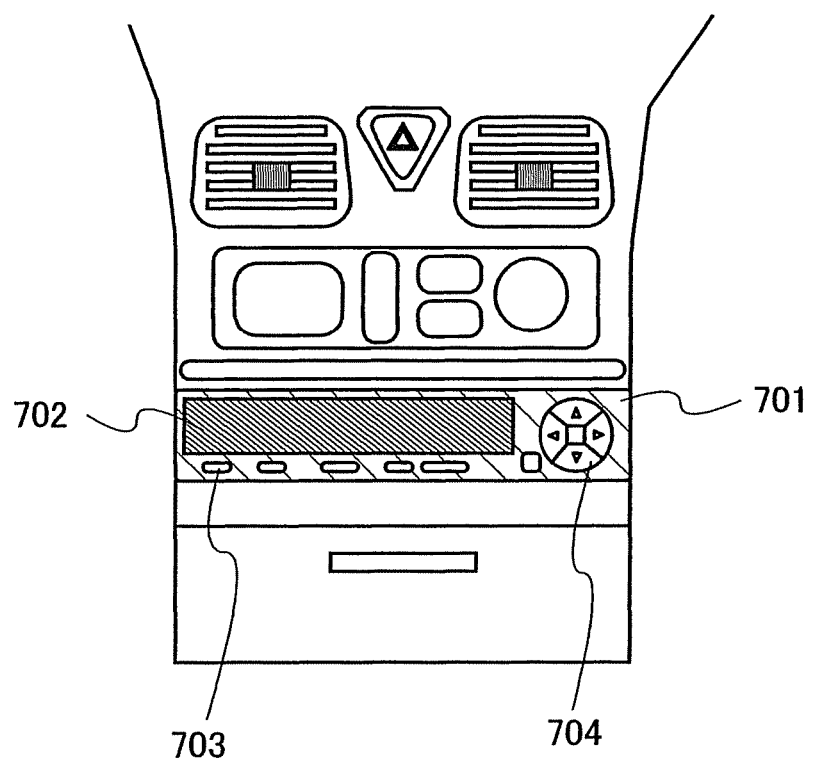
FIG. 11 illustrates an electronic device of the present invention.

FIG. 11 illustrates an audio reproducing device, specifically, a car audio system, which includes a main body 701, a display portion 702, and operation switches 703 and 704. The display portion 702 can be formed by using the light-emitting device (a passive matrix type or an active matrix type) described in Embodiment Mode 3. Further, the display portion 702 may be formed using a segment type light-emitting device. In any case, the use of the light-emitting element of the present invention makes it possible to form a bright display portion with long lifetime while achieving low power consumption by use of a vehicle power source (12 V to 42 V). Further, although this embodiment mode describes an in-car audio system, the present invention may also be used in a portable audio system or an audio system for home use.

Figure 12:
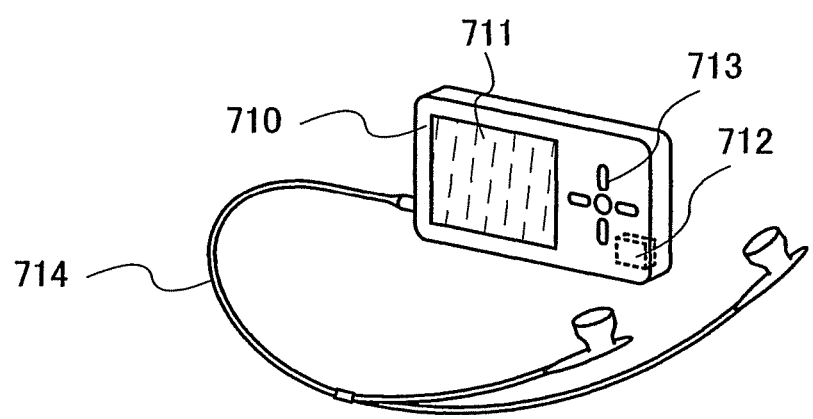
FIG. 12 illustrates an electronic device of the present invention.

FIG. 12 illustrates a digital player as an example of the above. The digital player illustrated in FIG. 12 includes a main body 710, a display portion 711, a memory portion 712, an operation portion 713, a pair of earphones 714, and the like. Note that a pair of headphones or a pair of wireless earphones can be used instead of the pair of earphones 714. The display portion 711 can be formed by using the light-emitting device (a passive matrix type or an active matrix type) described in Embodiment Mode 3. Further, the display portion 702 may be formed using a segment type light-emitting device. In any case, the use of the light-emitting element of the present invention makes it possible to form a bright display portion with long lifetime which is capable of display even when a secondary battery (a nickel-metal hydride battery or the like) is used, while achieving low power consumption. The memory portion 712 is formed using a hard disk or a nonvolatile memory. For example, a NAND-type nonvolatile memory with a recording capacity of 20 gigabytes (GB) to 200 gigabytes (GB) is used to operate the operation portion 713, whereby an image and a sound (music) can be recorded or reproduced. In the display portions 702 and 711, white characters are displayed against a black background, and thus, power consumption can be suppressed. This is particularly effective in a mobile audio device.

As described above, the range of application of the light-emitting device manufactured according to the present invention is very wide. The light-emitting device can be applied to electronic devices in various kinds of fields. By applying the present invention, an electronic device including a display portion which consumes low power and has high reliability can be manufactured.

Moreover, the light-emitting device to which the present invention is applied has a light-emitting element with high light emission efficiency, and the light-emitting device can also be used as a lighting system. One mode of using the light-emitting element to which the present invention is applied as a lighting system will be described with reference to FIG. 13.

Figure 13:
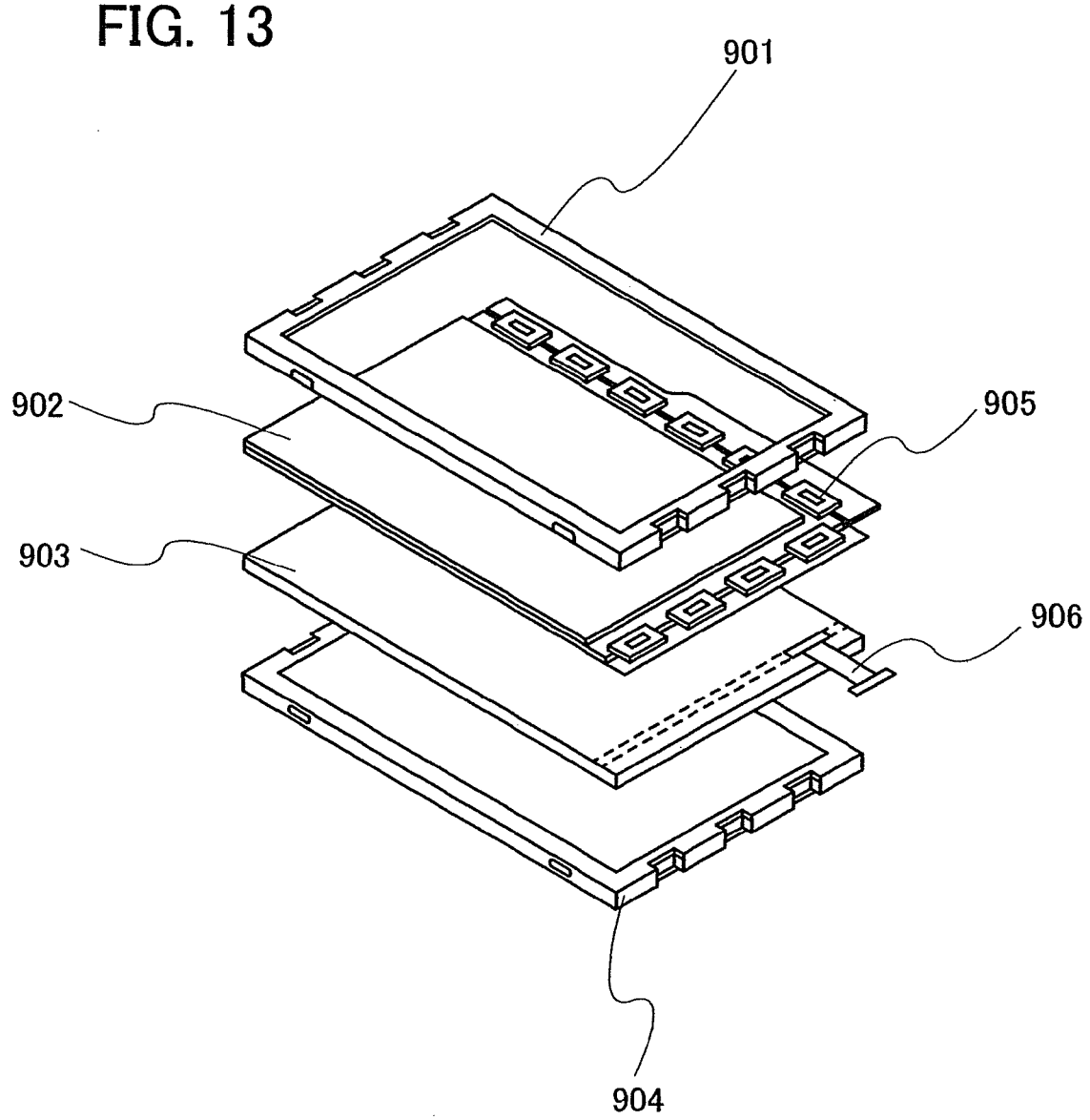
FIG. 13 illustrates an electronic device of the present invention.

FIG. 13 illustrates an example of a liquid crystal display device which uses the light-emitting device of the present invention as a backlight. The liquid crystal display device illustrated in FIG. 13 includes a chassis 901, a liquid crystal layer 902, a backlight 903, and a chassis 904, and the liquid crystal layer 902 is connected to a driver IC 905. The light-emitting device of the present invention is used for the backlight 903, and current is supplied through a terminal 906.

When the light-emitting device of the present invention is used as the backlight of the liquid crystal display device, a backlight with high light emission efficiency can be obtained. In addition, a backlight with long lifetime can be obtained. The light-emitting device of the present invention is used as a surface emission type lighting system, and can have a large area. Therefore, the backlight can have a large area, and a liquid crystal display device having a large area can be obtained. Furthermore, since the light-emitting device of the present invention is thin and consumes low power, the thickness and power consumption of a display device can also be reduced.

Figure 14:
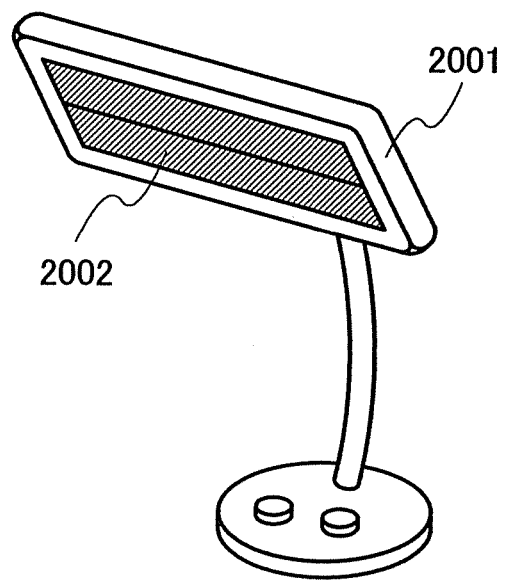
FIG. 14 illustrates a lighting system of the present invention.

FIG. 14 illustrates an example of using the light-emitting device, to which the present invention is applied, for a table lamp which is a lighting system. A table lamp illustrated in FIG. 14 has a chassis 2001 and a light source 2002, and the light-emitting device of the present invention is used as the light source 2002. Since the lifetime of the light-emitting device of the present invention is long, the lifetime of the table lamp is also long.

Figure 15:
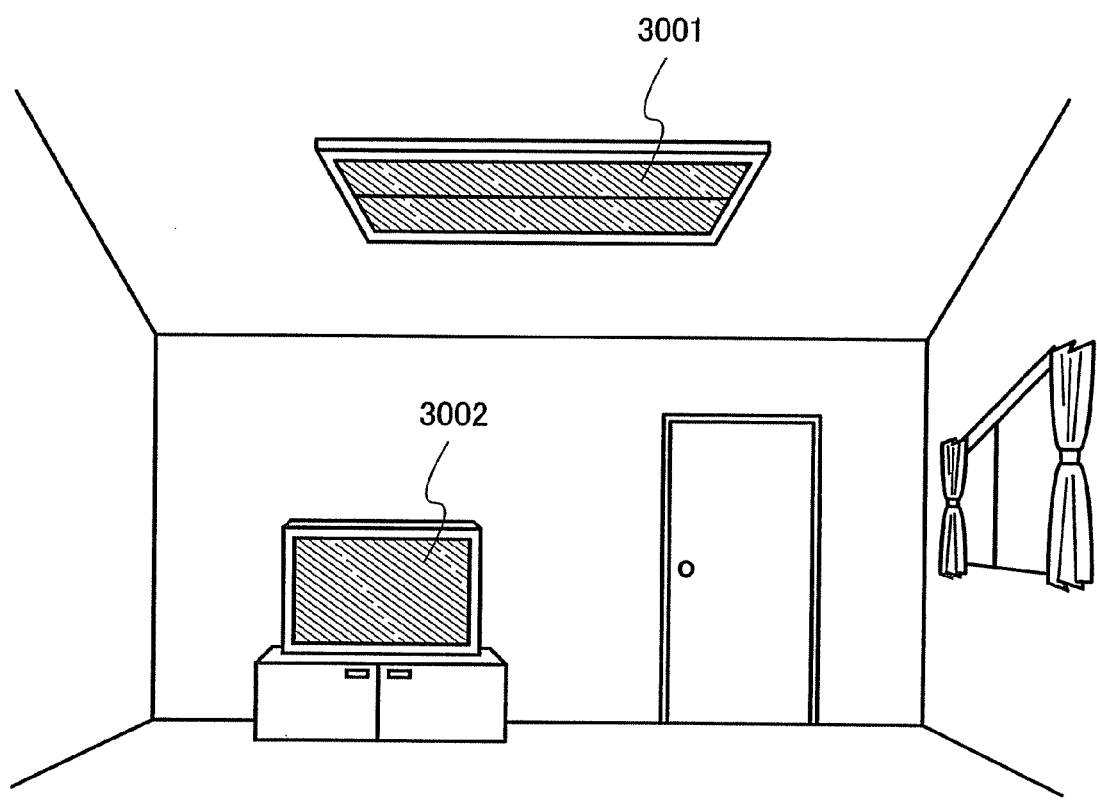
FIG. 15 illustrates a lighting system of the present invention.

FIG. 15 illustrates an example of using the light-emitting device, to which the present invention is applied, as an indoor lighting system 3001. Since the light-emitting device of the present invention can have a large area, the light-emitting device of the present invention can be used as a lighting system having a large area. Further, since the lifetime of the light-emitting device of the present invention is long, the light-emitting device of the present invention can be used for a long-lifetime lighting system. As illustrated in the drawing, a television device 3002 of the present invention as illustrated in FIG. 10A may be set in a room where the light-emitting device to which the present invention is applied is used as the indoor lighting system 3001, and public broadcasting or movies can be appreciated there. In such a case, since both of the devices have long lifetime, frequency of replacement of the lighting system and the television device can be reduced, and a burden on the environment can be reduced.

Note that this embodiment mode can be combined with other embodiment modes as appropriate.

Example 1

Figure 16:
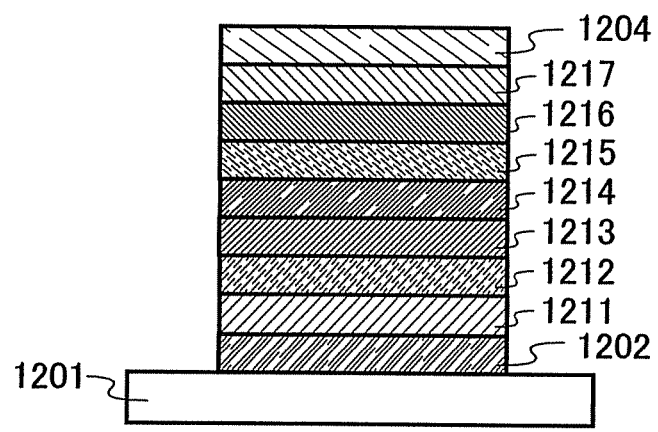
FIG. 16 illustrates a light-emitting element of Examples.

This example will specifically describe a light-emitting element of the present invention, with reference to FIG. 16. A structural formula of an organic compound used in Example 1 is shown below.

[Chemical Formula 1]

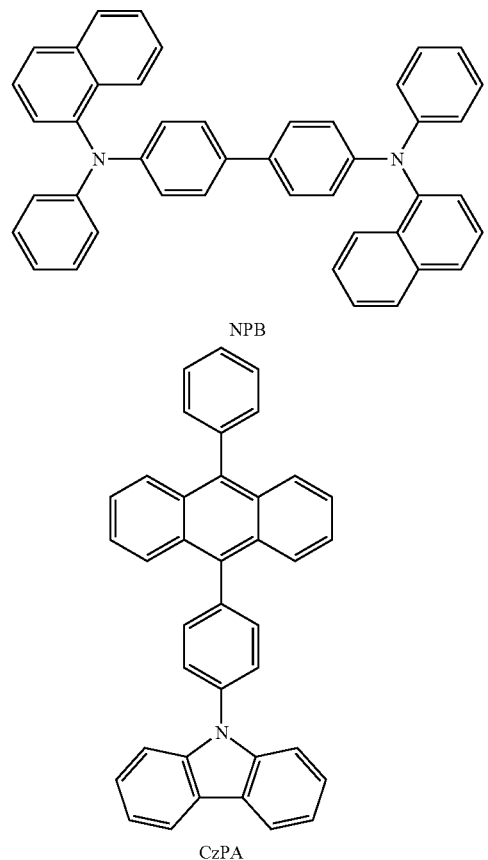

NPB

CzPA

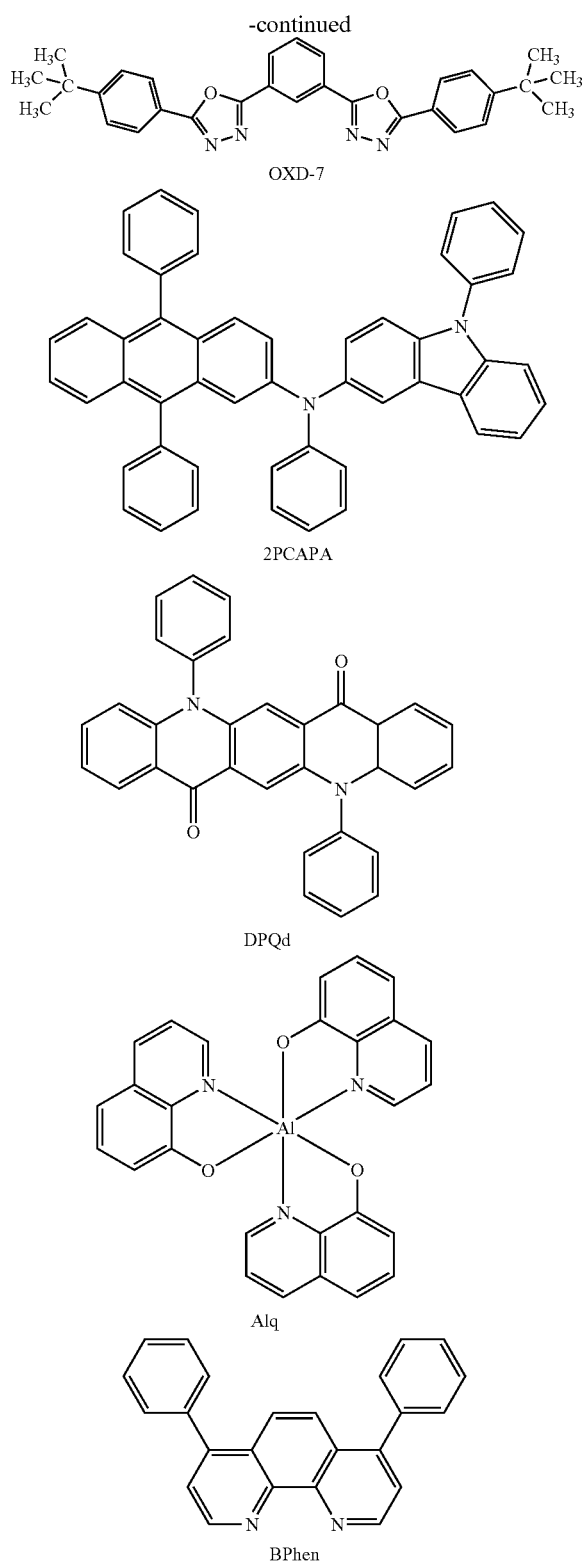

OXD-7

2PCAPA

DPQd

Alq

BPhen (Manufacturing of Light-Emitting Element 1)

First, a film of indium tin oxide containing silicon oxide was formed over a glass substrate 1201 by a sputtering method, whereby a first electrode 1202 was formed. Note that the thickness and the area of the first electrode 1202 were 110 nm and 2 mm×2 mm, respectively.

Next, the substrate having the first electrode 1202 was fixed to a substrate holder provided in a vacuum evaporation apparatus in such a way that a surface of the substrate 1201 provided with the first electrode 1202 faced downward, and then, the pressure was reduced to approximately $10^{-4}$ Pa. Then, 4,4'-bis[N-(1-naphthyl)-N-phenylamino]biphenyl (abbreviation: NPB) and molybdenum(VI) oxide were co-evaporated on the first electrode 1202, whereby a layer 1211 containing a composite material was formed. The thickness of the layer 1211 containing a composite material was 30 nm. The evaporation rate was adjusted so that the weight ratio of NPB to molybdenum(VI) oxide was 4:1 (=NPB:molybdenum oxide). Note that a co-evaporation method is an evaporation method in which evaporation is performed from a plurality of evaporation sources at the same time in one treatment chamber.

Next, a layer 1212 for controlling the hole transport was formed over the layer 1211 containing a composite material. The layer 1212 for controlling the hole transport was formed by co-evaporation of NPB and 1,3-bis[5-(p-tert-butylphenyl)-1,3,4-oxadiazol-2-yl]benzene (abbreviation: OXD-7) with a thickness of 10 nm. Here, the evaporation rate was adjusted so that the weight ratio of NPB to OXD-7 was 1:0.05 (=NPB:OXD-7).

Next, by an evaporation method using resistance heating, a film of 4,4'-bis[N-(1-naphthyl)-N-phenylamino]biphenyl (abbreviation: NPB) was formed so as to have a thickness of 20 nm, whereby a hole-transporting layer 1213 was formed over the layer 1212 for controlling the hole transport.

Next, a light-emitting layer 1214 was formed over the hole-transporting layer 1213. 9-[4-(10-phenyl-9-antryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated to form the light-emitting layer 1214 with a thickness of 30 nm. Here, the evaporation rate was adjusted so that the weight ratio of CzPA to 2PCAPA was 1:0.05 (=CzPA:2PCAPA).

Next, a layer 1215 for controlling the electron transport was formed over the light-emitting layer 1214. Tris(8-quinolinolato)aluminum(III) (abbreviation: Alq) and N-(9,10-diphenyl-2-anthryl)-N,9-diphenyl-9H-carbazol-3-amine (abbreviation: 2PCAPA) were co-evaporated to form the layer 1215 for controlling the electron transport with a thickness of 10 nm. Here, the evaporation rate was adjusted so that the weight ratio of Alq to 2PCAPA was 1:0.1 (=Alq:2PCAPA).

Next, by an evaporation method using resistance heating, a film of bathophenanthroline (abbreviation: BPhen) was formed with a thickness of 30 nm over the layer 1215 for controlling the electron transport, whereby an electron-transporting layer 1216 was formed.

Next, a film of lithium fluoride (LiF) was formed over the electron-transporting layer 1216 so as to have a thickness of 1 nm to form an electron-injecting layer 1217.

Finally, a film of aluminum was formed to have a thickness of 200 nm by an evaporation method using resistance heating to form a second electrode 1204. In this manner, a light-emitting element 1 was manufactured.

The light-emitting element 1 of the present invention obtained through the above process was put in a glove box in a nitrogen atmosphere, and the light-emitting element was sealed so as not to be exposed to the air. Then, the operating characteristics of the light-emitting element 1 were measured. Note that the measurement was performed at room temperature (an atmosphere kept at 25° C.).

(Manufacturing of Light-Emitting Element 2)

A light-emitting element 2 was manufactured in a similar manner to the light-emitting element 1 except that a film obtained by co-evaporation of Alq and N,N'-diphenylquinacridone (abbreviation: DPQd) was used for the layer 1215 for controlling the electron transport, instead of the film obtained by co-evaporation of Alq and 2PCAPA. Here, the evaporation rate was adjusted so that the weight ratio of Alq to DPQd was 1:0.005 (=Alq:DPQd).

The light-emitting element 2 of the present invention obtained through the above process was put in a glove box in a nitrogen atmosphere, and the light-emitting element was sealed so as not to be exposed to the air. Then, the operating characteristics of the light-emitting element 2 were measured. Note that the measurement was performed at room temperature (an atmosphere kept at 25° C.).

(Manufacturing of Reference Light-Emitting Element 3)

Next, for the sake of comparison, a reference light-emitting element 3 without the layer 1212 for controlling the hole transport and the layer 1215 for controlling the electron transport which are provided in the above-described light-emitting elements 1 and 2 was formed. A manufacturing method of the reference light-emitting element 3 is described below. First, a film of indium tin oxide containing silicon oxide was formed over a glass substrate by a sputtering method, whereby a first electrode was formed. Note that the thickness and the area of the first electrode were 110 nm and 2 mm×2 mm, respectively.

Next, the substrate having the first electrode was fixed to a substrate holder provided in a vacuum evaporation apparatus in such a way that a surface of the substrate provided with the first electrode faced downward, and then, the pressure was reduced to approximately $10^{-4}$ Pa. Next, 4,4'-bis[N-(1-naphthyl)-N-phenylamino]biphenyl (abbreviation: NPB) and molybdenum(VI) oxide were co-evaporated on the first electrode, whereby a layer containing a composite material was formed. The thickness of the layer containing a composite material was 50 nm. The evaporation rate was adjusted so that the weight ratio of NPB to molybdenum(VI) oxide was 4:1 (=NPB:molybdenum oxide). Note that a co-evaporation method is an evaporation method in which evaporation is performed from a plurality of evaporation sources at the same time in one treatment chamber.

Next, by an evaporation method using resistance heating, a film of 4,4'-bis[N-(1-naphthyl)-N-phenylamino]biphenyl (abbreviation: NPB) was formed so as to have a thickness of 10 nm, whereby a hole-transporting layer was formed.

Next, a light-emitting layer was formed over the hole-transporting layer. 9-[4-(10-phenyl-9-antryl)phenyl]-9H-carbazole (abbreviation: CzPA) and N-(9,10-diphenyl-2-anthryl)-N,9-diphenyl-9H-carbazol-3-amine (abbreviation: 2PCAPA) were co-evaporated to form the light-emitting layer with a thickness of 40 nm. Here, the evaporation rate was adjusted so that the weight ratio of CzPA to 2PCAPA was 1:0.05 (=CzPA:2PCAPA).

Next, by an evaporation method using resistance heating, a film of bathophenanthroline (abbreviation: BPhen) was formed to have a thickness of 30 nm over the light-emitting layer, whereby an electron-transporting layer was formed.

Next, a film of lithium fluoride (LiF) was formed over the electron-transporting layer so as to have a thickness of 1 nm, whereby an electron-injecting layer was formed.

Finally, by an evaporation method using resistance heating, a film of aluminum was formed so as to have a thickness of 200 nm, whereby a second electrode was formed. In this manner, the reference light-emitting element 3 was manufactured.

The reference light-emitting element 3 obtained through the above process was put in a glove box in a nitrogen atmosphere, and the light-emitting element was sealed so as not to be exposed to the air. Then, the operating characteristics of the reference light-emitting element 3 were measured. Note that the measurement was performed at room temperature (an atmosphere kept at 25° C.).

Figure 17:
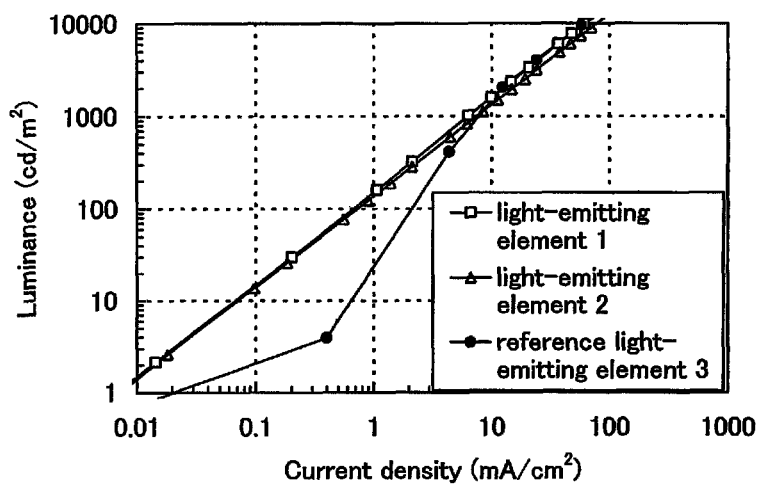
FIG. 17 is a graph showing current density vs. luminance characteristics of light-emitting elements manufactured in Example 1.
Figure 18:
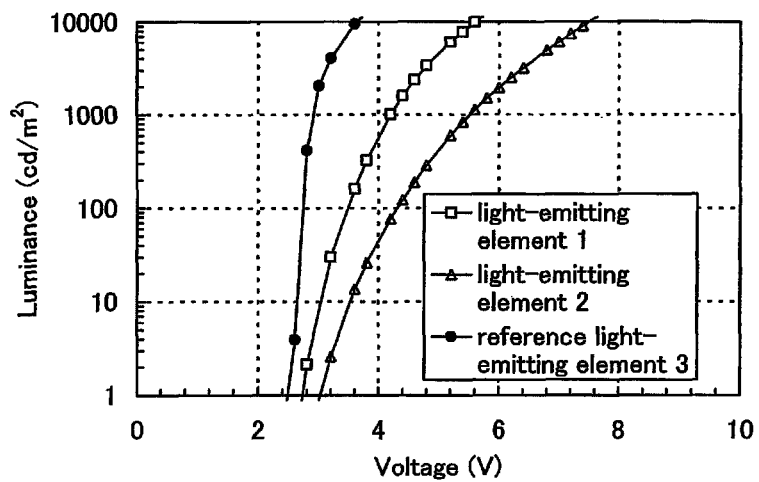
FIG. 18 is a graph showing voltage vs. luminance characteristics of light-emitting elements manufactured in Example 1.
Figure 19:
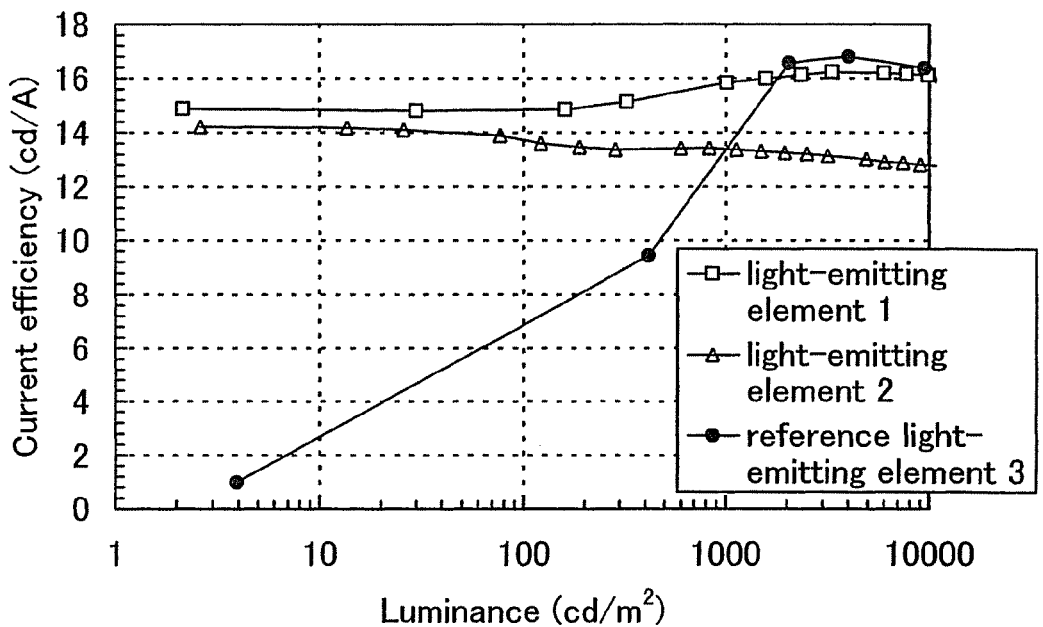
FIG. 19 is a graph showing luminance vs. current efficiency characteristics of light-emitting elements manufactured in Example 1.
Figure 20:
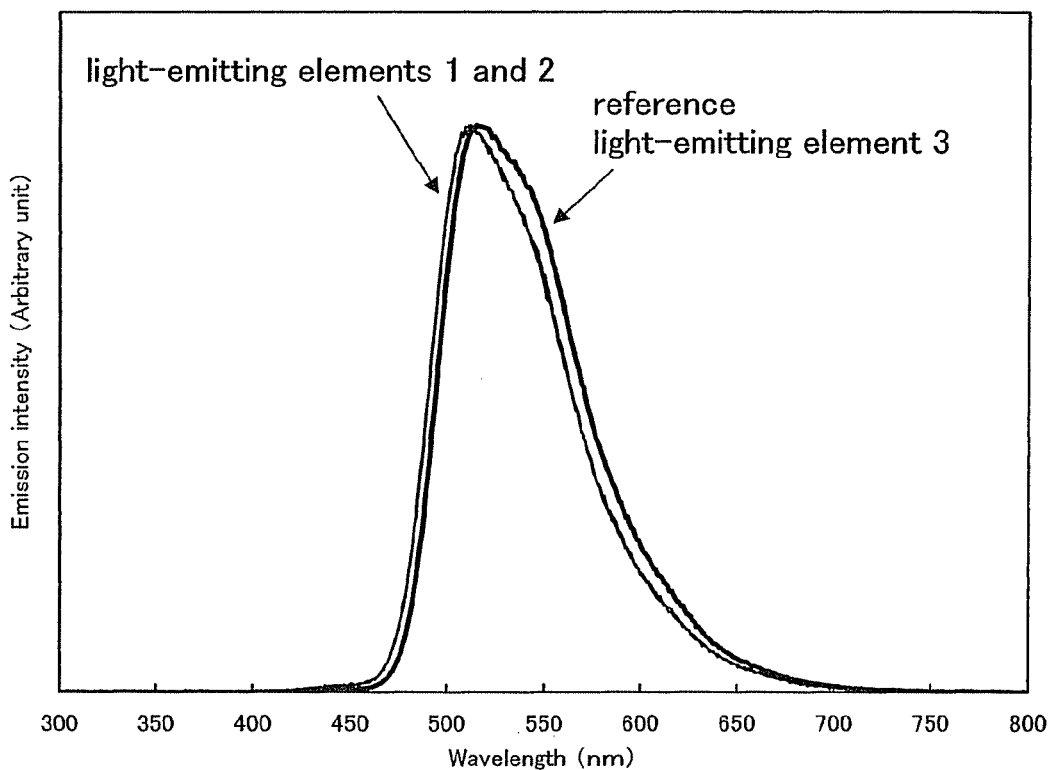
FIG. 20 is a graph showing emission spectra of light-emitting elements manufactured in Example 1.
Figure 21:
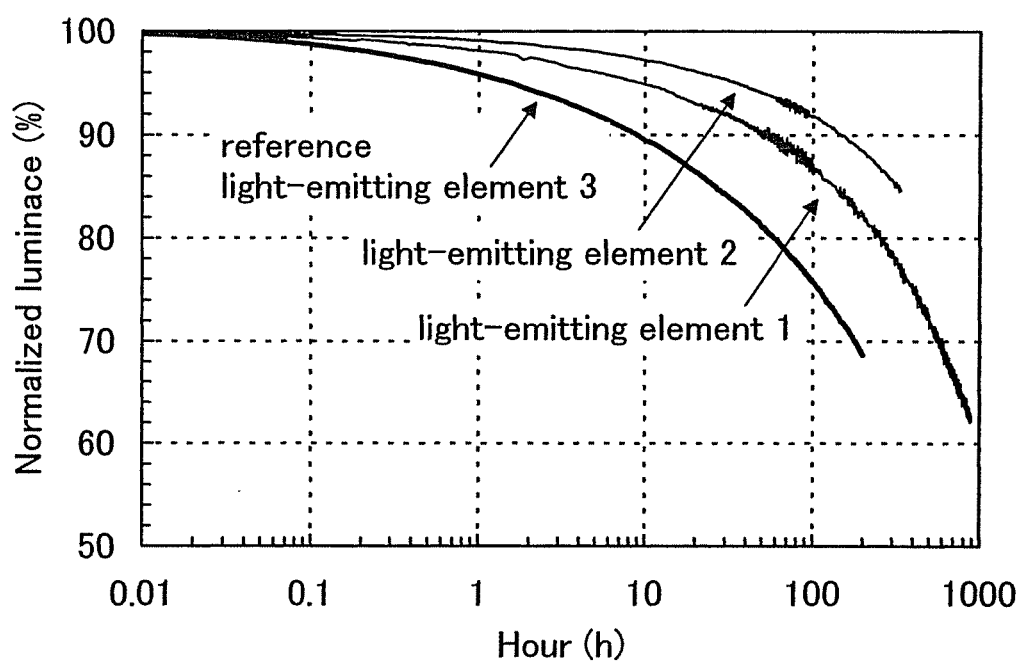
FIG. 21 is a graph showing time dependence of normalized luminance of light-emitting elements manufactured in Example 1.

FIG. 17 shows current density vs. luminance characteristics of the light-emitting element 1, the light-emitting element 2, and the reference light-emitting element 3. FIG. 18 shows voltage vs. luminance characteristics. FIG. 19 shows luminance vs. current efficiency characteristics. FIG. 20 shows the emission spectra with a current supply of 1 mA. FIG. 21 shows the result of a continuous lighting test by constant current driving with the initial luminance set at 5000 cd/m$^2$, which was conducted to the light-emitting element 1, the light-emitting element 2, and the reference light-emitting element 3 (the vertical axis indicates the relative luminance on the assumption that 5000 cd/m$^2$ is 100%).

The emission color of the light-emitting element 1 was located at the CIE chromaticity coordinates of (x=0.28, y=0.60) at the luminance of 5000 cd/m$^2$, and green light emission which derives from 2PCAPA was obtained. The current efficiency and driving voltage of the light-emitting element 1 at the luminance of 5000 cd/m$^2$ were 16.2 cd/A and 5.1 V, respectively.

Further, when a continuous lighting test by constant current driving was conducted to the light-emitting element 1 with the initial luminance set at 5000 cd/m$^2$, 87% of the initial luminance was maintained even after 100 hours. Thus, it was found that the light-emitting element 1 has long lifetime.

The emission color of the light-emitting element 2 was located at the CIE chromaticity coordinates of (x=0.28, y=0.61) at the luminance of 5000 cd/m$^2$, and green light emission which derives from 2PCAPA was obtained. In addition, the current efficiency and driving voltage of the light-emitting element 2 at the luminance of 5000 cd/m$^2$ were 13 cd/A and 6.8 V, respectively.

Further, when a continuous lighting test by constant current driving was conducted to the light-emitting element 2 with the initial luminance set at 5000 cd/m$^2$, 92% of the initial luminance was maintained even after 100 hours. Thus, it was found that the light-emitting element 2 has long lifetime.

The emission color of the reference light-emitting element 3 was located at the CIE chromaticity coordinates of (x=0.30, y=0.62) at the luminance of 5000 cd/m$^2$; the current efficiency of the reference light-emitting element 3 was 16.5 cd/A; and green light emission which derives from 2PCAPA was obtained similarly to the light-emitting elements 1 and 2. The current efficiency of the reference light-emitting element 3 are compared to those of the light-emitting elements 1 and 2, and it was found that the current efficiency of the reference light-emitting element 3 was substantially at the same level as the light-emitting element 1. In addition, when a continuous lighting test was conducted to the reference light-emitting element 3 with the initial luminance set at 5000 cd/m$^2$, luminance decreased to 76% of the initial luminance after 100 hours as shown in FIG. 21. Thus, it was found that the reference light-emitting element 3 has shorter lifetime than the light-emitting elements 1 and 2.

As described above, it was found that the light-emitting elements 1 and 2 have longer lifetime than the reference light-emitting element 3, and thus, it was found that a long-lifetime light-emitting element can be obtained by applying the present invention.

Example 2

In this example, oxidation characteristics of 1,3-bis[5-(p-tert-butylphenyl)-1,3,4-oxadiazol-2-yl]benzene (abbreviation: OXD-7) and 4,4'-bis[N-(1-naphthyl)-N-phenylamino]biphenyl (abbreviation: NPB), which were used for the layer for controlling the hole transport in the light-emitting elements 1 and 2 manufactured in Example 1, were measured by cyclic voltammetry (CV) measurement. Further, from the result, the HOMO levels of OXD-7 and NPB were calculated. Note that an electrochemical analyzer (ALS model 600A or 600C, manufactured by BAS Inc.) was used for the measurement.

As for a solution used for the CV measurement, dehydrated dimethylformamide (DMF, manufactured by Sigma-Aldrich Corp., 99.8%, catalog No. 22705-6) was used as a solvent, and tetra-n-butylammonium perchlorate (n-Bu$_4$NClO$_4$, manufactured by Tokyo Chemical Industry Co., Ltd., catalog No. T0836), which is a supporting electrolyte, was dissolved in the solvent such that the concentration of tetra-n-butylammonium perchlorate was 100 mmol/L. Further, the object to be measured was also dissolved in the solvent such that the concentration thereof was 1 mmol/L. A platinum electrode (a PTE platinum electrode, manufactured by BAS Inc.) was used as a working electrode. A platinum electrode (a VC-3 Pt counter electrode (5 cm), manufactured by BAS Inc.) was used as an auxiliary electrode. An Ag/Ag$^+$ electrode (an RE5 non-aqueous solvent type reference electrode, manufactured by BAS Inc.) was used as a reference electrode. The measurement was conducted at room temperature (20° C. to 25° C.).
[Calculation of Potential Energy of Reference Electrode with Respect to Vacuum Level]

First, potential energy (eV) of the reference electrode (Ag/Ag$^+$ electrode) used in Example 2 with respect to a vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). In contrast, when the oxidation-reduction potential of ferrocene in methanol was calculated using the reference electrode used in Example 2, the result was +0.20 [V vs. Ag/Ag$^+$]. Therefore, it was found that the potential energy of the reference electrode used in Example 2 is lower than that of the standard hydrogen electrode by 0.41 [eV].

It is also known that the potential energy of the standard hydrogen electrode with respect to a vacuum level is −4.44 eV (Reference: Toshihiro Ohnishi and Tamami Koyama, High-molecular EL material, Kyoritsu Shuppan, pp. 64-67). Accordingly, the potential energy of the reference electrode used in Example 2 with respect to a vacuum level could be calculated as follows: −4.44−0.41=−4.85 [eV].

Measurement Example 1

NPB

Figure 22:
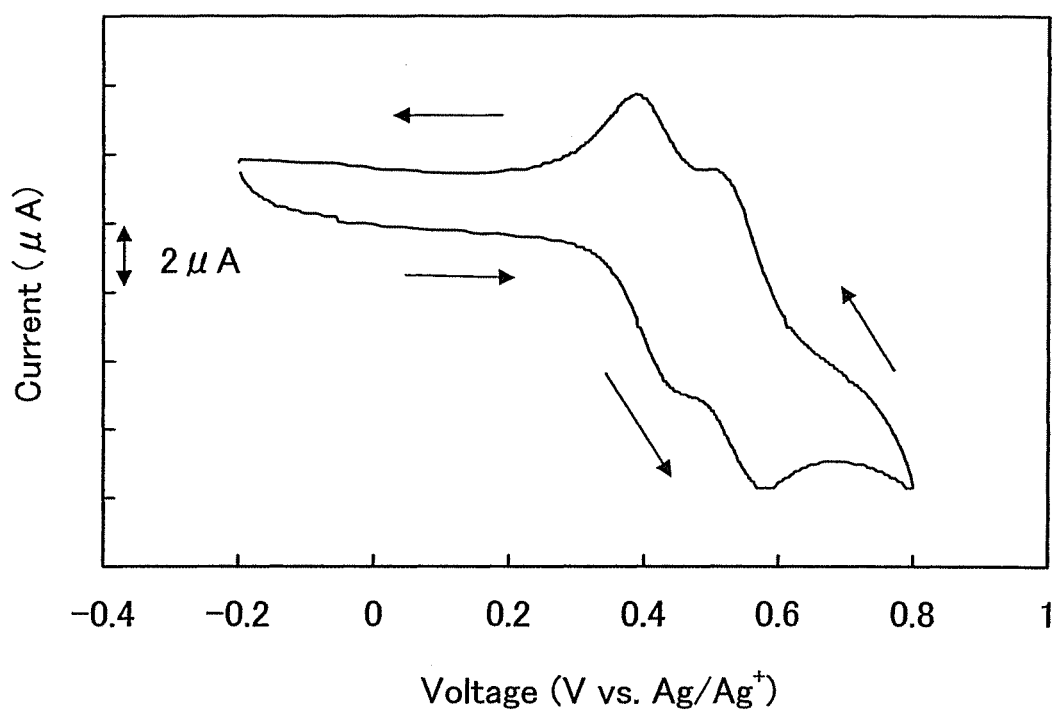
FIG. 22 is a graph showing an oxidation characteristic of OXD-7.

In this Measurement Example 1, the oxidation characteristic of NPB was examined by cyclic voltammetry (CV) measurement. The scan rate was set at 0.1 V/sec. FIG. 22 shows the measurement result. The measurement of the oxidation characteristic was performed by the steps of scanning the potential of the working electrode with respect to the reference electrode from −0.20 V to +0.80 V, and then from +0.80 V to −0.20 V.

As shown in FIG. 22, it can be seen that an oxidation peak potential $E_{pc}$ was +0.39 V and an oxidation peak potential $E_{pa}$ was +0.45 V. Therefore, a half-wave potential (an intermediate potential between $E_{pc}$ and $E_{pa}$) can be determined to be +0.42 V. This shows that NPB is oxidized by an electrical energy of +0.42 [V vs. Ag/Ag$^+$], and this energy corresponds to the HOMO level. Here, the potential energy of the reference electrode used in Example 2 with respect to a vacuum level was −4.85 [eV] as described above. Therefore, it was found that the HOMO level of NPB is −4.85−(+0.42)=−5.27 [eV].

Measurement Example 2

OXD-7

Figure 23:
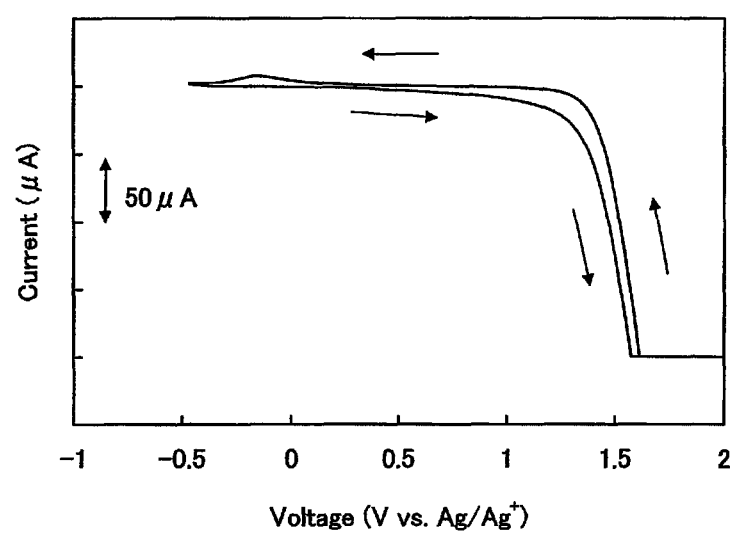
FIG. 23 is a graph showing an oxidation characteristic of NPB.

In this Measurement Example 2, the oxidation characteristic of OXD-7 was examined by cyclic voltammetry (CV) measurement. The scan rate was set at 0.1 V/sec. FIG. 23 shows the measurement result. Note that the measurement of the oxidation characteristic was performed by the steps of scanning the potential of the working electrode with respect to the reference electrode from −0.47 V to +1.60 V, and then from +1.60 V to −0.47 V.

As shown in FIG. 23, it is found that a peak which corresponds to the oxidation of OXD-7 did not appear even when scanning was performed up to 1.0 V. Further, even if there were a peak which indicates oxidation at a voltage greater than or equal to 1.0 V, the peak could not be observed due to the influence of flow of a large amount of current. Therefore, it can be concluded from this data that the peak indicating oxidation of OXD-7 is greater than or equal to 1.0 [V]. Since the potential energy of the reference electrode used in this Measurement Example with respect to a vacuum level was −4.85 [eV], an oxidation potential of 1.0 [V] in the CV measurement corresponds to an ionization potential of −(−4.85−1.0)=5.85 [eV]. Therefore, it was found that the ionization potential of OXD-7 is at least greater than or equal to 5.8 [eV].

Therefore, a difference between the oxidation peak potential of NPB and that of OXD-7 measured in the Measurement Example 1 is greater than or equal to 0.55 [V]. Therefore, a difference between the oxidation peak potential of NPB and that of OXD-7 is greater than or equal to 0.5 [V], which means that a difference between the ionization potential of NPB and that of OXD-7 is at least greater than or equal to 0.5 [eV].

The dipole moment of OXD-7 used in the light-emitting elements 1 and 2 was calculated. First, the structure of a ground state of OXD-7 was optimized by density functional theory (DFT) at a level of B3LYP/6-311(d,p). The dipole moment of OXD-7 with an optimized structure was calculated to be 3.78 debye. The accuracy of calculation of DFT is higher than that of a Hartree-Fock (HF) method which does not consider electron correlation, and calculation costs of DFT are lower than a method of perturbation (MP) which has the same level of accuracy of calculation as the DFT. Accordingly, the DFT was employed for this calculation. The calculation was performed using a high-performance computer (HPC) (Altix3700 DX, manufactured by SGI Japan, Ltd.).

Consequently, since OXD-7 used in the light-emitting elements 1 and 2 has a dipole moment of greater than or equal to 2.0 debye and an ionization potential of greater than or equal to 5.8 eV, OXD-7 can be preferably used for the layer for controlling the hole transport. That is, the layer containing NPB which is an organic compound with a hole-transporting property and OXD-7 functions as the layer for controlling the hole transport. Therefore, the element structure described in Example 1 in which OXD-7 and NPB are used for the layer for controlling the hole transport in the light-emitting element is preferable for the present invention.

Example 3

In this Example, reduction characteristics of tris(8-quinolinolato)aluminum(III) (abbreviation: Alq), N,N'-diphenylquinacridone (abbreviation: DPQd), and N-(9,10-diphenyl-2-anthryl)-N,9-diphenyl-9H-carbazol-3-amine (abbreviation: 2PCAPA), which were used for the layer for controlling the electron transport in the light-emitting elements 1 and 2 manufactured in Example 1, were measured by cyclic voltammetry (CV) measurement. Further, from the result, the LUMO levels of Alq, DPQd, and 2PCAPA were calculated. Note that an electrochemical analyzer (ALS model 600A or 600C, manufactured by BAS Inc.) was used for the measurement.

As for a solution used for the CV measurement, dehydrated dimethylformamide (DMF, manufactured by Sigma-Aldrich Corp., 99.8%, catalog No. 22705-6) was used as a solvent, and tetra-n-butylammonium perchlorate (n-Bu4NClO$_4$, manufactured by Tokyo Chemical Industry Co., Ltd., catalog No. T0836), which is a supporting electrolyte, was dissolved in the solvent such that the concentration of tetra-n-butylammonium perchlorate was 100 mmol/L. Further, the object to be measured was also dissolved in the solvent such that the concentration thereof was 1 mmol/L. A platinum electrode (a PTE platinum electrode, manufactured by BAS Inc.) was used as a working electrode. A platinum electrode (a VC-3 Pt counter electrode (5 cm), manufactured by BAS Inc.) was used as an auxiliary electrode. An Ag/Ag$^+$ electrode (an RE5 non-aqueous solvent type reference electrode, manufactured by BAS Inc.) was used as a reference electrode. The measurement was conducted at room temperature (20° C. to 25° C.).

[Calculation of Potential Energy of Reference Electrode with Respect to Vacuum Level]

In this Example, the same reference electrode as in Example 2 was used. Therefore, the potential energy of the reference electrode used in this Example with respect to a vacuum level is −4.44−0.41=−4.85 [eV].

Measurement Example 3

Alq

Figure 24:
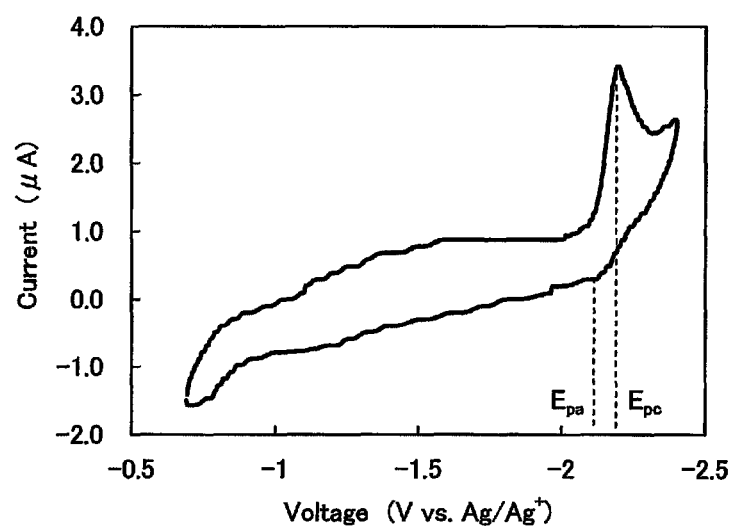
FIG. 24 is a graph showing a reduction characteristic of Alq.

The reduction characteristic of Alq was examined in this Measurement Example 3 by cyclic voltammetry (CV) measurement. The scan rate was set at 0.1 V/sec. FIG. 24 shows the measurement result. Note that the measurement of the reduction characteristic was conducted by the steps of scanning the potential of the working electrode with respect to the reference electrode from −0.69 V to −2.40 V, and then from −2.40 V to −0.69 V.

As shown in FIG. 24, it can be seen that a reduction peak potential $E_{pc}$ was −2.20 V and an oxidation peak potential $E_{pa}$ was −2.12 V. Therefore, a half-wave potential (an intermediate potential between $E_{pc}$ and $E_{pa}$) can be determined to be −2.16 V. This shows that Alq is reduced by an electrical energy of −2.16 [V vs. Ag/Ag$^+$], and this energy corresponds to the LUMO level. Here, the potential energy of the reference electrode used in Example 3 with respect to a vacuum level was −4.85 [eV] as described above. Therefore, it was found that the LUMO level of Alq is −4.85−(−2.16)=−2.69 [eV].

Measurement Example 4

DPQd

Figure 25:
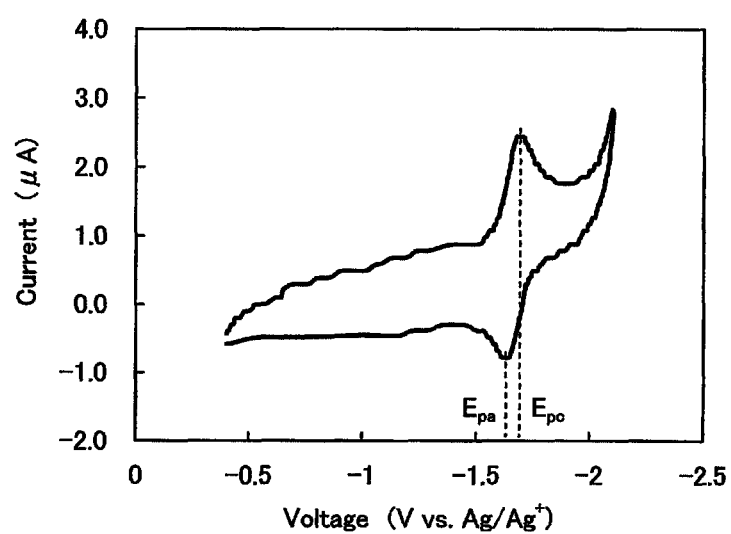
FIG. 25 is a graph showing a reduction characteristic of DPQd.

In this Measurement Example 4, the reduction characteristic of DPQd was examined by cyclic voltammetry (CV) measurement. The scan rate was set at 0.1 V/sec. FIG. 25 shows the measurement result. Note that the measurement of the reduction characteristic was conducted by the steps of scanning the potential of a working electrode with respect to a reference electrode from −0.40 V to −2.10 V, and then from −2.10 V to −0.40 V. Because DPQd has poor solubility, an undissolved residue of DPQd was generated also when the solution was prepared so as to have a concentration of DPQd of 1 mmol/L. Accordingly, in a state where the undissolved residue was precipitated, a supernatant solution was extracted and used for the measurement.

As shown in FIG. 25, it can be seen that a reduction peak potential $E_{pc}$ was −1.69 V and an oxidation peak potential $E_{pa}$ was −1.63 V. Therefore, a half-wave potential (an intermediate potential between $E_{pc}$ and $E_{pa}$) can be determined to be −1.66 V. This shows that DPQd is reduced by an electrical energy of −1.66 [V vs. Ag/Ag$^+$], and this energy corresponds to the LUMO level. Here, the potential energy of the reference electrode used in Example 3 with respect to a vacuum level was −4.85 [eV] as described above. Therefore, it was found that the LUMO level of DPQd is −4.85−(−1.66)=−3.19 [eV].

The above-obtained LUMO levels of Alq and DPQd were compared, and it was found that the LUMO level of DPQd was lower than that of Alq by as large as 0.50 [eV]. This means that DPQd functions as a trap for electrons as a result of addition of DPQd to Alq. Therefore, the element structure described in Example 1 in which Alq and DPQd are used as the layer for controlling the electron transport in the light-emitting element is preferable for the present invention.

Measurement Example 5

2PCAPA

Figure 26:
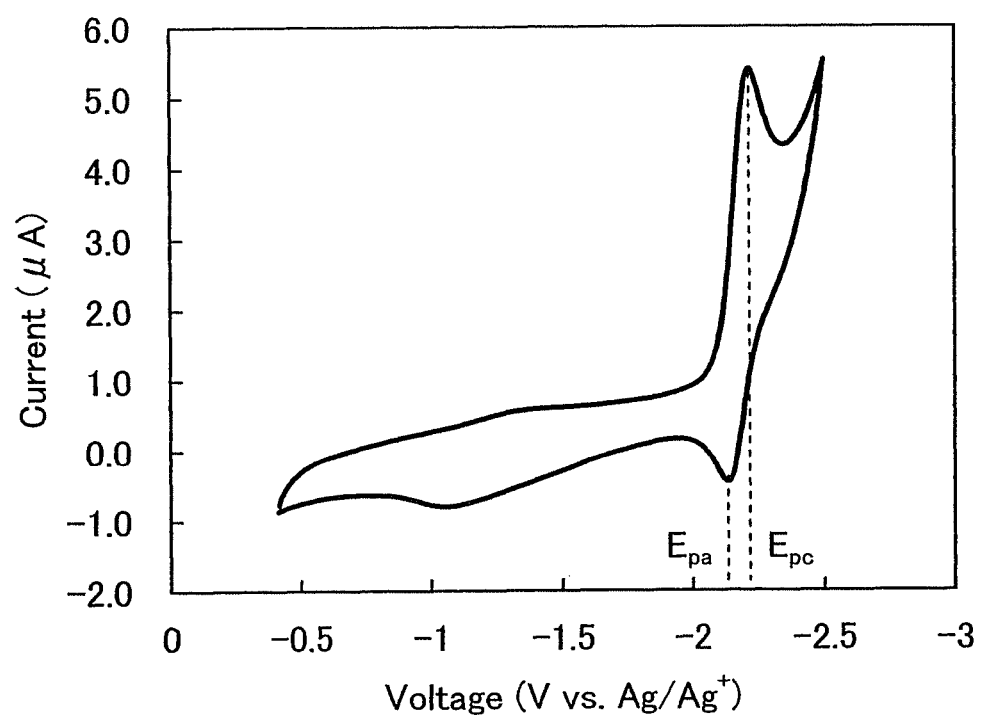
FIG. 26 is a graph showing a reduction characteristic of 2PCAPA.

In this Measurement Example 5, the reduction characteristic of 2PCAPA was examined by cyclic voltammetry (CV) measurement. The scan rate was set at 0.1 V/sec. FIG. 26 shows the measurement result. Note that the measurement of the reduction characteristic was conducted by the steps of scanning the potential of the working electrode with respect to the reference electrode from −0.41 V to −2.50 V, and then from −2.50 V to −0.41 V.

As shown in FIG. 26, it can be seen that a reduction peak potential $E_{pc}$ was −2.21 V and an oxidation peak potential $E_{pa}$ was −2.14 V. Therefore, a half-wave potential (an intermediate potential between $E_{pc}$ and $E_{pa}$) can be determined to be −2.18 V. This shows that Alq is reduced by an electrical energy of −2.18 [V vs. Ag/Ag$^+$], and this energy corresponds to the LUMO level. Here, the potential energy of the reference electrode used in Example 3 with respect to a vacuum level was −4.85 [eV] as described above. Therefore, it was found that the LUMO level of 2PCAPA is −4.85−(−2.18)=−2.67 [eV].

The above-obtained LUMO levels of Alq and 2PCAPA were compared, and it was found that the LUMO level of 2PCAPA is different from that of Alq by only 0.02 [eV]. In addition, Alq is a substance with a high electron-transporting property and 2PCAPA has a hole-transporting property because of its amine skeleton. Therefore, the element structure described in Example 1 in which Alq and 2PCAPA are used as the layer for controlling the electron transport in the light-emitting element is preferable for the present invention.

This application is based on Japanese Patent Application Serial No. 2007-237910 filed with Japan Patent Office on Sep. 13, 2007, the entire contents of which are hereby incorporated by reference.

What is claimed is:
1. A light-emitting element comprising:
a first electrode;
a hole-transporting layer over the first electrode;
a light-emitting layer over the hole-transporting layer;

an electron-transporting layer over the light-emitting layer;
a second electrode over the electron-transporting layer;
a first layer between the first electrode and the hole-transporting layer; and
a second layer between the light-emitting layer and the electron-transporting layer,
wherein the first layer comprises a first organic compound having a hole-transporting property and a second organic compound having an electron-transporting property,
wherein the second layer comprises a third organic compound having an electron-transporting property and a fourth organic compound having a hole-transporting property,
wherein the light-emitting layer consists essentially of a host material and a light-emitting material,
wherein the light-emitting material is a first phosphorescent compound,
wherein the host material is different from the third organic compound,
wherein the fourth organic compound is a second phosphorescent compound different from the first phosphorescent compound, and
wherein the hole-transporting layer consists essentially of the first organic compound.

2. The light-emitting element according to claim 1, wherein the second organic compound is any one of an oxadiazole derivative, a triazole derivative, and a phenanthroline derivative.

3. The light-emitting element according to claim 1, wherein a concentration of the second organic compound in the first layer is greater than or equal to 1 wt % and less than or equal to 20 wt %.

4. The light-emitting element according to claim 1, wherein a thickness of the first layer is greater than or equal to 1 nm and less than or equal to 20 nm.

5. The light-emitting element according to claim 1, wherein a concentration of the fourth organic compound in the second layer is greater than or equal to 0.1 wt % and less than or equal to 5 wt %.

6. The light-emitting element according to claim 1, wherein the second organic compound decreases a hole-transporting property of the first layer.

7. The light-emitting element according to claim 1, wherein the third organic compound is a metal complex.

8. The light-emitting element according to claim 1, wherein the second organic compound has a molecular structure having a heterocyclic.

9. The light-emitting element according to claim 1, wherein the fourth organic compound decreases an electron-transporting property of the second layer.

10. The light-emitting element according to claim 1, wherein the second organic compound is a substance to which a hole is not injected.

11. The light-emitting element according to claim 1, wherein a thickness of the second layer is greater than or equal to 5 nm and less than or equal to 20 nm.

12. The light-emitting element according to claim 1,
wherein the first layer is in contact with the hole-transporting layer, and
wherein the second layer is in contact with the light-emitting layer and the electron-transporting layer.

13. A light-emitting device comprising the light-emitting element according to claim 1 and a control unit configured to control light emission of the light-emitting element.

14. An electronic device comprising a display portion, the display portion comprising the light-emitting element according to claim 1 and a control unit configured to control light emission of the light-emitting element.

15. A light-emitting element comprising:
a first electrode;
a hole injection layer over the first electrode;
a hole-transporting layer over the hole injection layer;
a light-emitting layer over the hole-transporting layer;
an electron-transporting layer over the light-emitting layer;
a second electrode over the electron-transporting layer;
a first layer between the hole injection layer and the hole-transporting layer; and
a second layer between the light-emitting layer and the electron-transporting layer,
wherein the first layer comprises a first organic compound having a hole-transporting property and a second organic compound having an electron-transporting property,
wherein the second layer comprises a third organic compound having an electron-transporting property and a fourth organic compound having a hole-transporting property,
wherein the light-emitting layer consists essentially of a host material and a light-emitting material,
wherein the light-emitting material is a first phosphorescent compound,
wherein the host material is different from the third organic compound,
wherein the fourth organic compound is a second phosphorescent compound,
wherein the hole-transporting layer consists essentially of the first organic compound, and
wherein a difference between a peak wavelength of an emission spectrum of the fourth organic compound and that of the light-emitting layer is within 30 nm.

16. The light-emitting element according to claim 15, wherein the second organic compound is any one of an oxadiazole derivative, a triazole derivative, and a phenanthroline derivative.

17. The light-emitting element according to claim 15, wherein a concentration of the second organic compound in the first layer is greater than or equal to 1 wt % and less than or equal to 20 wt %.

18. The light-emitting element according to claim 15, wherein a thickness of the first layer is greater than or equal to 1 nm and less than or equal to 20 nm.

19. The light-emitting element according to claim 15, wherein a concentration of the fourth organic compound in the second layer is greater than or equal to 0.1 wt % and less than or equal to 5 wt %.

20. The light-emitting element according to claim 15, wherein the second organic compound decreases a hole-transporting property of the first layer.

21. The light-emitting element according to claim 15, wherein the third organic compound is a metal complex.

22. The light-emitting element according to claim 15, wherein the second organic compound has a molecular structure having a heterocyclic.

23. The light-emitting element according to claim 15, wherein the fourth organic compound decreases an electron-transporting property of the second layer.

24. The light-emitting element according to claim 15, wherein the hole injection layer comprises the first organic compound.

25. The light-emitting element according to claim 15, wherein the second organic compound is a substance to which a hole is not injected.

26. The light-emitting element according to claim 15, wherein a thickness of the second layer is greater than or equal to 5 nm and less than or equal to 20 nm.

27. The light-emitting element according to claim 15,
wherein the first layer is in contact with the hole injection layer and the hole-transporting layer, and
wherein the second layer is in contact with the light-emitting layer and the electron-transporting layer.

28. A light-emitting device comprising the light-emitting element according to claim 15 and a control unit configured to control light emission of the light-emitting element.

29. An electronic device comprising a display portion, the display portion comprising the light-emitting element according to claim 15 and a control unit configured to control light emission of the light-emitting element.

30. A light-emitting element comprising:
a first electrode;
a hole injection layer over the first electrode;
a hole-transporting layer over the hole injection layer;
a light-emitting layer over the hole-transporting layer;
an electron-transporting layer over the light-emitting layer;
a second electrode over the electron-transporting layer;
a first layer between the hole injection layer and the hole-transporting layer; and
a second layer between the light-emitting layer and the electron-transporting layer,
wherein the first layer comprises a first organic compound having a hole-transporting property and a second organic compound having an electron-transporting property,
wherein the second layer comprises a third organic compound having an electron-transporting property and a fourth organic compound having a hole-transporting property,
wherein the hole injection layer comprises a fifth organic compound and a metal oxide;
wherein the light-emitting layer consists essentially of a host material and a light-emitting material,
wherein the light-emitting material is a first phosphorescent compound,
wherein the host material is different from the third organic compound,
wherein the fourth organic compound is a second phosphorescent compound,
wherein the electron-transporting layer contains neither the third organic compound nor the fourth organic compound, and
wherein the hole-transporting layer consists essentially of the first organic compound.

31. The light-emitting element according to claim 30, wherein the second organic compound is any one of an oxadiazole derivative, a triazole derivative, and a phenanthroline derivative.

32. The light-emitting element according to claim 30, wherein a concentration of the second organic compound in the first layer is greater than or equal to 1 wt % and less than or equal to 20 wt %.

33. The light-emitting element according to claim 30, wherein a thickness of the first layer is greater than or equal to 1 nm and less than or equal to 20 nm.

34. The light-emitting element according to claim 30, wherein a concentration of the fourth organic compound in the second layer is greater than or equal to 0.1 wt% and less than or equal to 5 wt %.

35. The light-emitting element according to claim 30, wherein the second organic compound decreases a hole-transporting property of the first layer.

36. The light-emitting element according to claim 30, wherein the third organic compound is a metal complex.

37. The light-emitting element according to claim 30, wherein the second organic compound has a molecular structure having a heterocyclic.

38. The light-emitting element according to claim 30, wherein the fourth organic compound decreases an electron-transporting property of the second layer.

39. The light-emitting element according to claim 30, wherein the fifth organic compound contained in the hole injection layer is the first organic compound.

40. The light-emitting element according to claim 30, wherein the second organic compound is a substance to which a hole is not injected.

41. The light-emitting element according to claim 30, wherein a thickness of the second layer is greater than or equal to 5 nm and less than or equal to 20 nm.

42. The light-emitting element according to claim 30,
wherein the first layer is in contact with the hole injection layer and the hole-transporting layer, and
wherein the second layer is in contact with the light-emitting layer and the electron-transporting layer.

43. A light-emitting device comprising the light-emitting element according to claim 30 and a control unit configured to control light emission of the light-emitting element.

44. An electronic device comprising a display portion, the display portion comprising the light-emitting element according to claim 30 and a control unit configured to control light emission of the light-emitting element.

* * * * *